US012720992B2

(12) United States Patent
Wang et al.

(10) Patent No.: US 12,720,992 B2
(45) Date of Patent: Aug. 25, 2026

(54) OLED DISPLAY WITH SPACER ADJACENT TO PIXEL WITH CHAMFERED CORNER

(71) Applicants: Chengdu BOE Optoelectronics Technology Co., Ltd., Chengdu (CN); BOE Technology Group Co., Ltd., Beijing (CN)

(72) Inventors: Benlian Wang, Beijing (CN); Lili Du, Beijing (CN); Cong Liu, Beijing (CN); Chengjie Qin, Beijing (CN); Wei Zhang, Beijing (CN); Weiyun Huang, Beijing (CN); Ming Hu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 730 days.

(21) Appl. No.: 18/029,317

(22) PCT Filed: Mar. 8, 2022

(86) PCT No.: PCT/CN2022/079643
§ 371 (c)(1),
(2) Date: Mar. 29, 2023

(87) PCT Pub. No.: WO2022/267549
PCT Pub. Date: Dec. 29, 2022

(65) Prior Publication Data
US 2023/0371336 A1 Nov. 16, 2023

(30) Foreign Application Priority Data
Jun. 25, 2021 (CN) ......................... 202110711261.4

(51) Int. Cl.
*H10K 59/35* (2023.01)
*H10K 59/122* (2023.01)

(52) U.S. Cl.
CPC ......... *H10K 59/353* (2023.02); *H10K 59/122* (2023.02)

(58) Field of Classification Search
CPC .................................................... H10K 59/353
See application file for complete search history.

(56) References Cited

U.S. PATENT DOCUMENTS

2012/0033160 A1 2/2012 Tashiro et al.
2014/0252321 A1 9/2014 Pyon et al.
(Continued)

FOREIGN PATENT DOCUMENTS

CN 104051493 A 9/2014
CN 107871774 A 4/2018
(Continued)

OTHER PUBLICATIONS

Mar. 19, 2024—(EP) Extended European Search Report—App 22827054.2.

(Continued)

*Primary Examiner* — Peter Bradford
(74) *Attorney, Agent, or Firm* — Banner & Witcoff, Ltd.

(57) ABSTRACT

A display substrate and a display apparatus are provided. The display substrate includes a base substrate, sub-pixels, a pixel defining layer having openings, spacers on the pixel defining layer. A shape of at least one of the openings is a polygon with at least one vertex angle cut off, and a corner portion of the opening includes a first corner portion formed by cutting off one vertex angle included between two sides of the polygon from the polygon. At least one of the spacers is arranged at an interval between the first corner portion and the opening adjacent to the first corner portion, and a connecting line between a geometric center of the opening where the first corner portion is located and a geometric (Continued)

center of the opening adjacent to the first corner portion passes through the first corner portion and the spacer.

20 Claims, 13 Drawing Sheets

(56) References Cited

U.S. PATENT DOCUMENTS

| | | | | |
|---|---|---|---|---|
| 2014/0319479 | A1 | 10/2014 | Park et al. | |
| 2014/0319484 | A1* | 10/2014 | Kwon | H10K 59/35 257/40 |
| 2015/0102320 | A1 | 4/2015 | Jung | |
| 2015/0261050 | A1 | 9/2015 | Chen et al. | |
| 2015/0311473 | A1* | 10/2015 | Kim | H10K 59/122 |
| 2016/0254476 | A1 | 9/2016 | Park | |
| 2018/0130838 | A1 | 5/2018 | Tian et al. | |
| 2021/0004123 | A1 | 1/2021 | Tan et al. | |
| 2021/0175299 | A1 | 6/2021 | Lee et al. | |
| 2021/0408163 | A1* | 12/2021 | Heo | H10K 50/171 |
| 2022/0069027 | A1 | 3/2022 | Wang et al. | |
| 2022/0310710 | A1 | 9/2022 | Hu et al. | |
| 2022/0336539 | A1 | 10/2022 | Luo et al. | |
| 2023/0180565 | A1 | 6/2023 | Cao et al. | |

FOREIGN PATENT DOCUMENTS

| | | | | | |
|---|---|---|---|---|---|
| CN | 207883217 | U | | 9/2018 | |
| CN | 108922919 | A | | 11/2018 | |
| CN | 109637362 | A | | 4/2019 | |
| CN | 109935617 | A | | 6/2019 | |
| CN | 110133919 | A | | 8/2019 | |
| CN | 110308822 | A | | 10/2019 | |
| CN | 111799320 | A | | 10/2020 | |
| CN | 112368840 | A | * | 2/2021 | H10K 59/352 |
| CN | 112470287 | A | | 3/2021 | |
| CN | 112864215 | A | | 5/2021 | |
| CN | 112968040 | A | * | 6/2021 | H10K 59/353 |
| CN | 113421910 | A | | 9/2021 | |
| CN | 215644495 | U | | 1/2022 | |
| EP | 4170723 | A1 | | 4/2023 | |
| EP | 4207305 | A1 | | 7/2023 | |
| KR | 20200060861 | A | | 6/2020 | |

OTHER PUBLICATIONS

Dec. 12, 2024—(CN) First Office Action—App 202110711261.4 with English Translation.

Nov. 13, 2025—(IN) First Examination Report—App 202317025454.

* cited by examiner

OLED DISPLAY WITH SPACER ADJACENT TO PIXEL WITH CHAMFERED CORNER

CROSS-REFERENCE TO RELATED APPLICATION(S)

The present application is a U.S. National Phase of International Application No. PCT/CN2022/079643 filed on Mar. 8, 2022, which claims the priority of China Patent Application No. 202110711261.4 filed on Jun. 25, 2021, and the disclosure of the above-mentioned applications are incorporated herein by reference as a part of the present application.

TECHNICAL FIELD

At least one embodiment of the present disclosure relates to a display substrate and a display apparatus.

BACKGROUND

Organic Light-Emitting Display (OLED) is a kind of self-luminous device with a series of advantages such as high brightness, full viewing angle, fast response and flexible display. Organic light-emitting diode displays can be classified into Passive Matrix OLED (PMOLED) and Active Matrix OLED (AMOLED) according to a driving mode. AMOLED devices have higher luminous efficiency and can be used as large-size display apparatuses with high resolution.

SUMMARY

At least one embodiment of the disclosure provides a display substrate and a display apparatus.

At least one embodiment of the disclosure provides a display substrate, comprising: a base substrate; a plurality of sub-pixels located on the base substrate, the plurality of sub-pixels comprising a plurality of light-emitting regions; a pixel defining layer located on the base substrate, the pixel defining layer comprising a plurality of openings to define the plurality of light-emitting regions; and a plurality of spacers located at a side of the pixel defining layer away from the base substrate and distributed at an interval between adjacent openings, wherein, a shape of at least one of the plurality of openings is a polygon with at least one vertex angle cut off, and a corner portion of the opening comprises a first corner portion formed by cutting off one vertex angle included between two sides of the polygon from the polygon; at least one of the plurality of spacers is arranged at an interval between the first corner portion and the opening adjacent to the first corner portion, and a connecting line between a geometric center of the opening where the first corner portion is located and a geometric center of the opening adjacent to the first corner portion passes through the first corner portion and the spacer.

For example, in an embodiment of the disclosure, a ratio of a length of a portion of at least one of the two sides that is cut off to a length of the side is 0.2-0.8.

For example, in an embodiment of the disclosure, each of the plurality of spacers is arranged at an interval between the first corner portion and the opening adjacent to the first corner portion.

For example, in an embodiment of the disclosure, the number of the openings having the first corner portion is not less than the number of the plurality of spacers.

For example, in an embodiment of the disclosure, the openings having the first corner portion are configured to define the light-emitting regions of the sub-pixels of at least one color.

For example, in an embodiment of the disclosure, the openings having the first corner portion comprise a same type of openings.

For example, in an embodiment of the disclosure, the openings that have the first corner portion and are configured to define the light-emitting regions of the sub-pixels of the same color comprise at least two types of openings, in different types of openings, vertices of the first corner portions point to vertices of the corner portions opposite to the first corner portions in different directions, and at least part of the plurality of spacers are distributed at the intervals corresponding to the same type of openings.

For example, in an embodiment of the disclosure, the plurality of spacers comprise a plurality of first spacers, the plurality of first spacers are distributed at the intervals corresponding to the first corner portions of the same type of openings, and are uniformly distributed.

For example, in an embodiment of the disclosure, the at least two types of openings comprise a first type of openings and a second type of openings, and the plurality of first spacers are distributed at the intervals corresponding to the first corner portions of at least part of the first type of openings; the plurality of spacers further comprise a plurality of second spacers, the plurality of second spacers are distributed at the intervals corresponding to the first corner portions of at least part of the second type of openings and are uniformly distributed.

For example, in an embodiment of the disclosure, the at least two types of openings further comprise a third type of openings and a fourth type of openings, and in two types of openings among the first type of openings, the second type of openings, the third type of openings and the fourth type of openings, directions in which vertices of first corner portions point to vertices of corner portions opposite to the first corner portions are opposite to each other, and in the other two types of openings among the first type of openings, the second type of openings, the third type of openings and the fourth type of openings, directions in which vertices of first corner portions point to vertices of corner portions opposite to the first corner portions are opposite to each other.

For example, in an embodiment of the disclosure, at least part of the spacers are distributed at the intervals between the first corner portions of the openings configured to define sub-pixels of different colors and the openings adjacent to the first corner portions.

For example, in an embodiment of the disclosure, each of at least two openings closely adjacent to at least one spacer comprises the first corner portion, and the first corner portion of each of the at least two openings is the corner portion of the opening closest to the spacer.

For example, in an embodiment of the disclosure, each of the plurality of sub-pixels comprises a light-emitting element, the light-emitting element comprises a first electrode, a light-emitting layer and a second electrode which are arranged in a stacked manner, wherein the second electrode is located at a side of the light-emitting layer facing the base substrate, and the second electrode comprises a main electrode, and a shape of the main electrode of the sub-pixels corresponding to at least part of the openings having the first corner portion is approximately the same as a shape of the opening.

For example, in an embodiment of the disclosure, the plurality of sub-pixels comprise a plurality of first color sub-pixels, a plurality of second color sub-pixels and a plurality of third color sub-pixels, the plurality of first color sub-pixels and the plurality of third color sub-pixels are alternately arranged along both a row direction and a column direction to form a plurality of first pixel rows and a plurality of first pixel columns, the plurality of second color sub-pixels are arranged in an array along both the row direction and the column direction to form a plurality of second pixel rows and a plurality of second pixel columns, the plurality of first pixel rows and the plurality of second pixel rows are alternately arranged along the column direction and staggered from each other in the row direction, and the plurality of first pixel columns and the plurality of second pixel columns are alternately arranged along the row direction and staggered from each other in the column direction; the plurality of openings comprise a plurality of first openings, a plurality of second openings and a plurality of third openings, wherein the plurality of first openings are configured to define the light-emitting regions of the plurality of first color sub-pixels, the plurality of second openings are configured to define the light-emitting regions of the plurality of second color sub-pixels, and the plurality of third openings are configured to define the light-emitting regions of the plurality of third color sub-pixels; at least one of the first opening, the second opening or the third opening comprises the first corner portion.

For example, in an embodiment of the disclosure, at least part of the plurality of spacers are distributed at the intervals between two adjacent openings arranged along at least one of the column direction or the row direction.

For example, in an embodiment of the disclosure, four second color sub-pixels are arranged between adjacent spacers along one of the row direction and the column direction, and two first color sub-pixels and two third color sub-pixels are arranged between adjacent spacers along the other of the row direction and the column direction; or, six second color sub-pixels are arranged between adjacent spacers along one of the row direction and the column direction, and three first color sub-pixels and three third color sub-pixels are arranged between adjacent spacers along the other of the row direction and the column direction; or, four second color sub-pixels are arranged between adjacent spacers along one of the row direction and the column direction, and three first color sub-pixels and three third color sub-pixels are arranged between adjacent spacers along the other of the row direction and the column direction; or, six second color sub-pixels are arranged between adjacent spacers along one of the row direction and the column direction, and two first color sub-pixels and two third color sub-pixels are arranged between adjacent spacers along the other of the row direction and the column direction.

For example, in an embodiment of the disclosure, the openings that have the first corner portion and are configured to define the light-emitting regions of the sub-pixels of the same color comprise at least two types of openings, in different types of openings, vertices of the first corner portions point to vertices of the corner portions opposite to the first corner portions in different directions, the plurality of spacers comprise a plurality of first spacers and a plurality of second spacers, and the first spacers and the second spacers are distributed at the intervals corresponding to the first corner portions of different types of openings.

For example, in an embodiment of the disclosure, four second color sub-pixels are arranged between adjacent first spacers along one of the row direction and the column direction, and two first color sub-pixels and two third color sub-pixels are arranged between adjacent first spacers along the other of the row direction and the column direction; four second color sub-pixels are arranged between adjacent second spacers along one of the row direction and the column direction, and two first color sub-pixels and two third color sub-pixels are arranged between adjacent second spacers along the other of the row direction and the column direction.

For example, in an embodiment of the disclosure, at least part of the plurality of third openings comprise the first corner portion, and the spacers are each arranged at the interval between the first corner portion of the third opening and the first opening adjacent to the first corner portion.

For example, in an embodiment of the disclosure, a distance between the spacer and the first corner portion located at one side of the spacer is a first distance, and a shortest distance between the spacer and the corner portion of the opening located at the other side of the spacer is a second distance, and the first distance is not less than the second distance.

For example, in an embodiment of the disclosure, a connecting line between corner portions opposite to each other of two openings located at two sides of the spacer in at least one of the row direction or the column direction and closely adjacent to the spacer is located at a side of a geometric center of the spacer away from the first corner portion.

For example, in an embodiment of the disclosure, two openings adjacent in at least one of the row direction or the column direction both comprise the first corner portion, and the first corner portions of the two openings are two corner portions closest to each other.

For example, in an embodiment of the disclosure, at least part of the openings each comprise at least two first corner portions.

For example, in an embodiment of the disclosure, a largest size of at least one spacer in a direction parallel to the connecting line between the geometric center of the opening where the first corner portion is located and the geometric center of the opening adjacent to the first corner portion is a first size, and a largest size of the at least one spacer in a direction perpendicular to the connecting line is a second size, and the first size is smaller than the second size.

For example, in an embodiment of the disclosure, the display substrate comprises a display area, at least part of the plurality of spacers and the plurality of sub-pixels are located in the display area, and a ratio of the number of the spacers each located at the interval between the first corner portion and the opening adjacent to the first corner portion to the number of the spacers located in the display area is not less than 50%.

For example, in an embodiment of the disclosure, the light-emitting layers of the sub-pixels of the same color have a same shape and a same size, and a distance between a boundary of the light-emitting layer on the pixel defining layer and the first corner portion corresponding to the light-emitting layer is different from distances between the boundary of the light-emitting layer on the pixel defining layer and other corner portions corresponding to the light-emitting layer.

For example, in an embodiment of the disclosure, the corner portion of the opening further comprises a second corner portion, and a distance from an intersection of two sides connected to two end points of the first corner portion or their extension lines to the geometric center of the opening is greater than a distance from an intersection of two sides constituting the second corner portion or their extension lines to the geometric center of the opening.

At least one embodiment of the disclosure provides a display apparatus, comprising the display substrate according to any embodiments as mentioned above.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components.

Embodiments of the present disclosure provide a display substrate and a display apparatus. The display substrate includes a base substrate, and a plurality of sub-pixels, a pixel defining layer and a plurality of spacers located on the base substrate. The plurality of sub-pixels include a plurality of light-emitting regions; the pixel defining layer includes a plurality of openings to define the plurality of light-emitting regions; the plurality of spacers are located at a side of the pixel defining layer away from the base substrate and are distributed at intervals between adjacent openings. The shape of at least one opening is the shape of a polygon with at least one vertex angle cut off, and a corner portion of the opening includes a first corner portion which is a corner portion formed by cutting off a vertex angle included between two sides of a polygon from the polygon; at least one spacer is arranged at an interval between the first corner portion and the opening adjacent to the first corner portion, and a connecting line between a geometric center of the opening where the first corner portion is located and a geometric center of the opening adjacent to the first corner portion passes through the first corner portion and the spacer. According to the embodiment of the present disclosure, by arranging the spacer at an interval position of the opening of the pixel defining layer corresponding to the first corner portion, it's beneficial to improving the process yield or improving the supporting function of the spacer.

Hereinafter, the display substrate provided by an embodiment of the present disclosure will be described by way of example with reference to the accompanying drawings.

Figure 1:
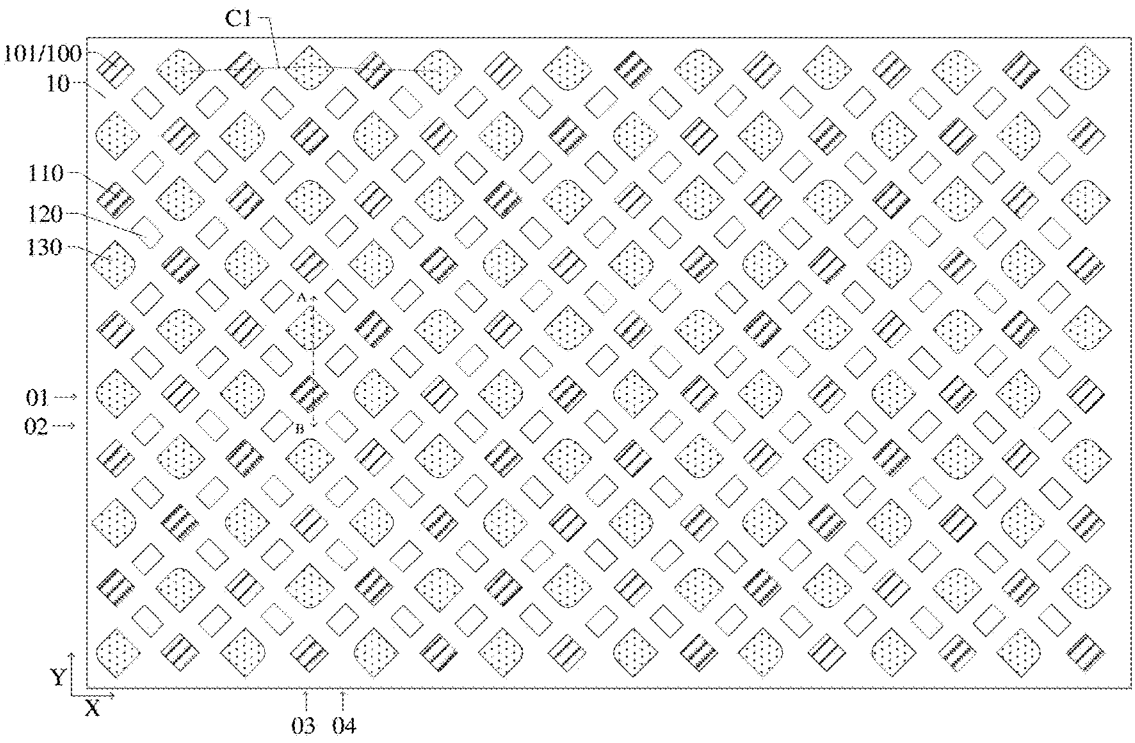
FIG. 1 is a schematic diagram of a partial planar structure of a pixel arrangement provided according to an example of an embodiment of the present disclosure.
Figure 2:
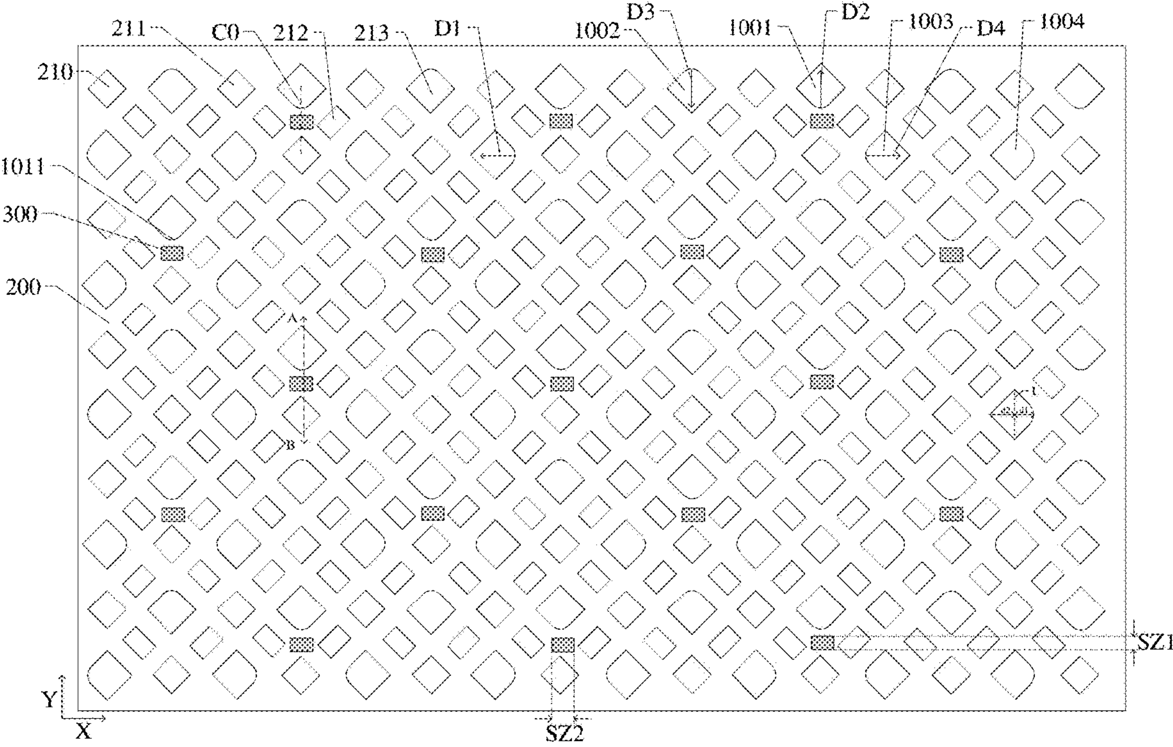
FIG. 2 is a schematic diagram of a planar structure of a pixel defining layer and a spacer provided according to an example of an embodiment of the present disclosure.
Figure 3:
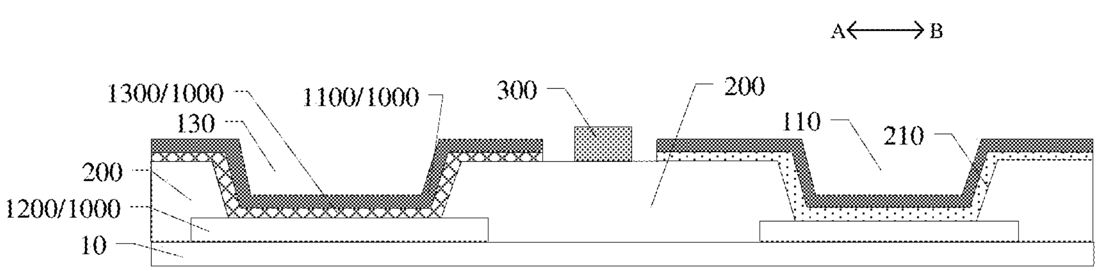
FIG. 3 is a schematic diagram of a partial cross-sectional structure taken along the line AB shown in FIGS. 1 and 2.

FIG. 1 is a schematic diagram of a partial planar structure of a pixel arrangement provided according to an example of an embodiment of the present disclosure, FIG. 2 is a schematic diagram of a planar structure of a pixel defining layer and a spacer provided according to an example of an embodiment of the present disclosure, and FIG. 3 is a schematic diagram of a partial cross-sectional structure taken along the line AB shown in FIGS. 1 and 2. As shown in FIGS. 1 to 3, the display substrate includes a base substrate 10, a plurality of sub-pixels 100 located on the base substrate 10, a pixel defining layer 200, and a plurality of spacers (PS) 300 located at a side of the pixel defining layer 200 away from the base substrate 10. The plurality of sub-pixels 100 include a plurality of light-emitting regions 101, for example, each sub-pixel 100 includes a light-emitting region 101, and the pixel defining layer 200 includes a plurality of openings 210 to define the light-emitting regions 101 of the plurality of sub-pixels 100.

For example, as shown in FIGS. 1 to 3, the shape of the light-emitting region 101 of each sub-pixel 100 is substantially the same as the shape of the opening of the pixel defining layer 200. For example, each sub-pixel 100 includes a light-emitting element 1000, the light-emitting element 1000 includes a first electrode 1100, a light-emitting layer 1300 and a second electrode 1200 that are arranged in a stacked manner; and the second electrode 1200 is located at the side of the light-emitting layer 1300 facing the base substrate 10. For example, at least part of the second electrode 1200 is located at the side of the pixel defining layer 200 facing the base substrate 10. When the light-emitting layer 1300 is formed in the opening 210 of the pixel defining layer 200, the first electrode 1100 and the second electrode 1200 located at two sides of the light-emitting layer 1300 can drive the light-emitting layer 1300 in the opening 210 of the pixel defining layer 200 to emit light. For example, a functional layer may be further arranged between the light-emitting layer 1300 and the first electrode 1100, and/or, between the light-emitting layer 1300 and the second electrode 1200. For example, the functional layer includes any one or more layers selected from the group consisted of a hole injection layer, a hole transport layer, an electron transport layer, a hole blocking layer, an electron blocking layer, an electron injection layer, an auxiliary light-emitting layer, an interface improvement layer, an antireflection layer and the like.

For example, as shown in FIGS. 1 to 3, an orthographic projection of the opening 210 of the pixel defining layer 200 on the base substrate 10 is within an orthographic projection of the corresponding light-emitting layer 1300 on the base substrate 10, that is, the light-emitting layer 1300 covers the opening 210 of the pixel defining layer 200. For example, the area of the light-emitting layer 1300 is larger than the area of the corresponding opening 210 of the pixel defining layer 200; that is to say, in addition to a part located inside the opening 210 of the pixel defining layer 200, the light-emitting layer 1300 at least further includes another part covering a physical structure of the pixel defining layer 200. Generally, the light-emitting layer 1300 covers all the physical structures of the pixel defining layer 200 at respective boundaries of the openings 210 of the pixel defining layer 200.

As shown in FIGS. 1 to 3, the plurality of spacers 300 are distributed at the intervals between adjacent openings 210 of the pixel defining layer 200. For example, the above-mentioned "interval" refers to the physical structure of the pixel defining layer 200 between adjacent openings 210, for example, the spacer 300 is located on the physical structure of the pixel defining layer 200.

For example, as shown in FIG. 1 to FIG. 3, the pixel defining layer 200 and the spacer 300 are described as two structures independent from each other in the embodiment of the present disclosure by way of example, which however is not limited to this; the spacer and the pixel defining layer may be an integral structure, for example, they may be formed integrally in the same single patterning process and have no obvious boundary. For example, the spacer and the pixel defining layer can be bounded by a position where an inflection point of a slope angle curve appears. For example, for the pixel defining layer itself, the slope angle may be varied from large to small in a direction from an opening edge located at both sides of a center line along an extension direction of the pixel defining layer towards the center line along the extension direction of the pixel defining layer, and the slope angle may be approximately 0 degree to 5 degrees when reaching an almost flat surface of the pixel defining layer; on the almost flat surface of the pixel-defining layer, the slope angle shows an upward trend again upon reaching a boundary of the spacer. For example, at the boundary of the spacer, the slope angle can be roughly increased from approximately 0 degree to about 10 degrees (for example, 5 degrees to 10 degrees), or more than 10 degrees. The above-mentioned slope angle can be an included angle between a tangent line at a measuring point and a plane where a surface of the closest second electrode (such as anode) away from the base substrate is located. For example, the thickness of a portion of the pixel defining layer not provided with a spacer is a first thickness (for example, the average thickness of an almost flat portion), and the maximum thickness of a portion of the pixel defining layer provided with the spacer is a second thickness. The boundary between the spacer and the pixel defining layer can be defined in such a way that, the pixel defining layer itself is delimited from a surface of the pixel defining layer close to the base substrate to the portion with the first thickness, while the spacer is delimited from a portion with a thickness exceeding the first thickness to the portion with the second thickness. For example, the first thickness (e.g., the average thickness of the almost flat portion) may be 0.8 μm to 1.8 μm. For example, the first thickness may be greater than or equal to 1.1 μm. For example, the first thickness may be smaller than 3 μm. Because the pixel defining layer is used as a part of a barrier dam of an organic encapsulation layer and has a too small thickness, it may be easy for the organic layer to overflow and affect the encapsulation effect. If the first thickness of the pixel defining layer is too great, it would be easy to significantly limit the light-emitting angle and affect the light-emitting efficiency.

For example, the slope angle of the portion of the pixel defining layer 200 close to the opening 210 may be 15 degrees to 25 degrees. For example, the slope angle of the portion of the pixel defining layer 200 close to the opening 210 may be 17 degrees to 21 degrees. For example, the slope angle of the portion of the pixel defining layer 200 close to the opening 210 may be 18 degrees to 20 degrees.

For example, FIG. 3 schematically shows that the spacer is arranged on the pixel defining layer but it is not limited to this, and the spacer can also be arranged on other film layers, for example, the spacer can be arranged on the opposite substrate.

Figure 4A:
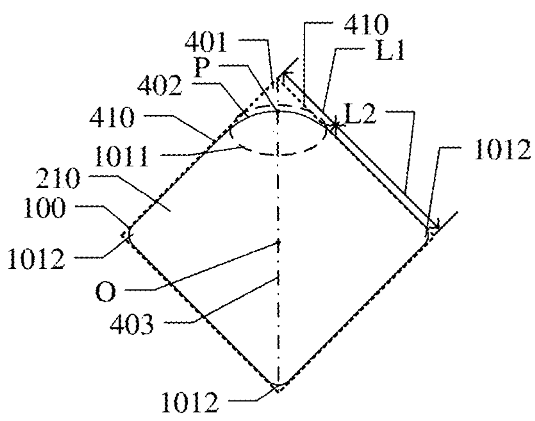
FIG. 4A is a schematic diagram of a shape of an opening shown in FIG. 2.

FIG. 4A is a schematic diagram of a shape of an opening shown in FIG. 2. As shown in FIGS. 1 to 4A, the shape of at least one opening 210 is the shape of a polygon 400 with at least one vertex angle 401 cut off; a corner portion of the opening 210 includes a first corner portion 1011 formed by cutting off a vertex angle 401 included between two sides 410 of the polygon 400. For example, a section line 402 for cutting off the vertex angle 401 of the polygon 400 may include a line segment with a regular shape such as a curve or a straight line, or an irregular shape.

For example, respective sides of each opening 210 or the extension lines thereof are connected in turn to form a polygon 400, and a plurality of vertex angles of part of these polygons 400 have regions that are not overlapped with the plurality of corner portions of the corresponding openings; the plurality of corner portions of at least one opening 210 include at least a first corner portion 1011, and an area of the region of the first corner portion 1011 not overlapped with the vertex angle of the corresponding polygon 400 is larger than an area of the region of each of at least part of the remaining corner portions not overlapped with the vertex angle of the polygon 400 corresponding to the corner portion.

For example, the embodiment of the present disclosure schematically shows that the polygon 400 is a quadrilateral. For example, the shape of the polygon 400 corresponding to at least one opening 210 can be a diamond, a rectangle or a square, but it is not limited to this. The polygon 400 can also be a triangle, a pentagon, a hexagon or the like, and the embodiment of the present disclosure is not intended to limit the shape of the polygon. For example, the angles of the respective corner portions of the polygon can be equal or different.

For example, as shown in FIG. 4A, the first corner portion 1011 includes a vertex P which may be on a connecting line 403, and a curve (i.e., an outer edge of the corner portion) formed by portions of two sides connected with two ends of the first corner portion 1011 that are extending towards the vertex P and intersected at the vertex P allows the first corner portion 1011 to become a rounded angle. In this case, the first corner portion 1011 can be in the range of x microns along the contour from the vertex P as a center, and the value of x microns can be 2 microns to 7 microns. For example, the corner portions of the opening 210 further includes a second corner portion 1012, and the distance from an intersection of two sides connected to two ends of the first corner portion 1011 or their extension lines to the geometric center of the opening 210 is greater than the distance from an intersection of two sides constituting the second corner portion 1012 or their extension lines to the geometric center of the opening 210. For example, if the first corner portion is a rounded angle and if a corner portion opposite to the first corner portion (for example, the second corner portion) in the shape of the opening is a right angle or an acute angle, the distance from the intersection of the extension lines of the two straight sides connected to the two ends of the first corner portion to the geometric center O of the opening 210 is greater than the distance from the intersection of the extension lines of the two straight sides constituting the corner portion opposite to the first corner portion to the geometric center O.

The above-mentioned "rounded angle" is a corner portion formed by a curve, which can be a circular arc or an irregular curve, such as a curve sectioned from an ellipse and a wavy line. The embodiment of the present disclosure schematically shows that the curve has an outwardly convex shape relative to the geometric center O of the opening 210 but it is not limited to this, and the curve may also have an inwardly concave shape relative to the geometric center O of the opening 210. For example, when the curve is a circular arc which is outwardly convex, the central angle of the circular arc can range from 10 degrees to 150 degrees. For example, the central angle of the circular arc can range from 60 degrees to 120 degrees. For example, the central angle of the circular arc can be 90 degrees. For example, the curve length of the rounded angle included in the first corner portion 1011 may be 10 microns to 60 microns.

For example, when the first corner portion 1011 is a rounded angle, a radius of curvature thereof may be 5 microns to 20 microns.

Figure 4B:
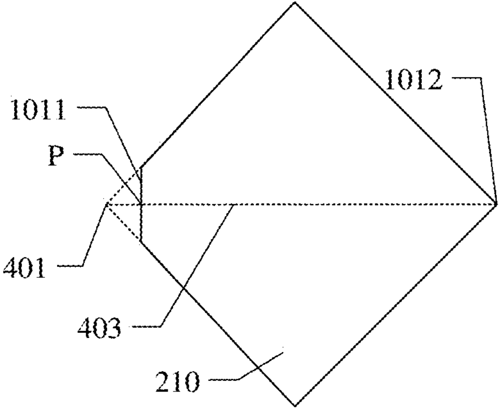
FIG. 4B is a schematic diagram of another shape of a light-emitting region.

For example, FIG. 4B is a schematic diagram of a shape of another light-emitting region. As shown in FIG. 4B, the above-described first corner portion can also be a line segment (i.e., the outer edge of the corner portion) formed by portions of two sides constituting a certain vertex angle that are extending towards a vertex P of this certain vertex angle and intersected at the vertex P, so that the first corner portion becomes a chamfered angle. For example, the first corner portion 1011 includes a chamfered angle, and the vertex of the first corner portion can be on the connecting line 403, for example, the vertex may be an intersection of the connecting line 403 and the chamfered angle.

As shown in FIGS. 1 to 4A, at least one spacer 300 is arranged at an interval between a first corner portion 1011 and an adjacent opening 210, and the first corner portion 1011 is located at the side of the geometric center of the opening 210, where the first corner portion is located, close to the adjacent opening 210, so that the first corner portion 1011 faces the adjacent opening 210. When the outer edge of the first corner portion 1011 is an outwardly convex curve, the expression that "the first corner portion 1011 faces the adjacent opening 210" refers to that, the outer edge of the first corner portion 1011 is protruded towards the adjacent opening.

As shown in FIGS. 1 to 4A, a connecting line C01 between the geometric center of the opening 201 where the first corner portion 1011 is located and the geometric center of the adjacent opening 210 passes through the first corner portion 1011 and the spacer 300.

According to the embodiment of the present disclosure, the spacer is arranged at an interval position of the opening of the pixel defining layer corresponding to the first corner portion, which is beneficial to improving the process yield or improving the supporting function of the spacer. The above-mentioned "interval position of the opening of the pixel defining layer corresponding to the first corner portion" refers to the interval that is connected with the outer edge of the corner portion.

According to the embodiment of the present disclosure, the spacer is arranged at the interval corresponding to the first corner portion, so that the distance between the spacer and the opening can be increased and/or the size of the spacer can be increased, and that the probability for the spacer to fall off can be reduced, which is beneficial to improving the process yield of products.

The spacer can play a role of supporting a fine metal mask (FMM) for evaporating the light-emitting layer when the light-emitting layer or other film layers of the sub-pixel is formed by evaporation. The FMM has a plurality of through holes which can be formed by etching, and an evaporation material is deposited on the pixel defining layer from bottom to top through these through holes. Because the FMM is made of a metal material, it is easy to damage the material deposited on the base substrate when the FMM contacts with the base substrate. In order to prevent the FMM from damaging the film layer in the display substrate, spacers are arranged on the pixel defining layer to support the FMM during evaporation and prevent the FMM from scratching the surface of the pixel defining layer and other film layers. During evaporation, the base substrate is placed above the FMM, and the spacer is attached to the FMM. According to the embodiment of the present disclosure, spacers are arranged at intervals corresponding to the corner portions, so that the distance between the spacers and the openings can be increased, and/or, the size of the spacers can be increased, which is beneficial to improving the supporting effect of the spacers for the fine metal mask.

For example, as shown in FIGS. 1 to 4A, if the first corner portion 1011 in an opening 210 faces downwards (a direction opposite to the direction indicated by the arrow of Y direction in FIG. 2), the spacer 300 is arranged at an interval at the lower side of the opening 210. The embodiment of the present disclosure is not limited to this. If the first corner portion of an opening faces upwards (a direction indicated by the arrow of Y direction shown in FIG. 2), the spacer is arranged at an interval at the upper side of the opening; if the first corner portion of an opening faces rightwards (a direction indicated by the arrow of X direction shown in FIG. 2), the spacer is arranged at an interval at the right side of the opening; if the first corner portion of an opening faces leftwards (a direction opposite to the direction indicated by the arrow of X direction as shown in FIG. 2), the spacer is arranged at an interval at the left side of the opening. In the embodiment of the present disclosure, the first corner portion of an opening is not limited to be orientated upwards, downwards, leftwards or rightwards (all of these orientations are generally parallel to a row direction and a column direction) as mentioned above, but may also be oriented in an oblique direction, which is a direction intersected with both the row direction and the column direction. For example, an included angle between the oblique direction and the row direction may be 20 degrees to 80 degrees, or 30 degrees to 70 degrees, or 45 degrees to 60 degrees, etc. For example, the first corner portion of the opening can also be orientated obliquely upwards (for example, obliquely upwards to the left or obliquely upwards to the right) or obliquely downwards (for example, obliquely downwards to the left or obliquely downwards to the right).

For example, as shown in FIGS. 1 to 4A, the spacer 300 is provided with two openings 210 adjacent to each other at both sides of the spacer 300 in one direction, and at least one opening 210 is provided with a first corner portion 1011 which is located between the spacer 300 and the geometric center of the at least one opening 210.

For example, as shown in FIGS. 1 to 4A, if at least one opening 210 closely adjacent to the spacer 300 is provided with a first corner portion 1011, the first corner portion 1011 is the corner portion closest to the spacer 300 among all corner portions of the opening 210.

For example, as shown in FIGS. 1 to 4A, a portion of at least one of the two sides (e.g., the first side 410) of the polygon 400 that is cut off has a length L1, then a ratio of the length L1 to the length of the side 410 is 0.2 to 0.8. After a first line segment L1 is cut off from the first side 410 of the polygon 400, the remaining portion L2 forms a side of the opening 210 which is connected to the first corner portion 1011. For example, both ends of the first corner portion 1011 are connected with two straight sides of the opening 210, and at least one of these two straight sides is the remaining straight side after the first line segment L1 is cut off from the first side 410 of the polygon 400.

For example, at least one first vertex angle 401 may be cut off from the polygon 400 to form at least one first corner portion 1011. For example, one polygon 400 may include a plurality of first vertex angles 401 with equal degrees, and a plurality of first corner portions 1011 formed after cutting off the plurality of first vertex angles 401 may have identical parameters, such as the shape and the size.

For example, as shown in FIGS. 1 and 4A, the ratio of the length of the first line segment L1 to the length of the first side 410 is 0.3 to 0.7. For example, the ratio of the length of the first line segment L1 to the length of the first side 410 is 0.4 to 0.6. For example, the ratio of the length of the first line segment L1 to the length of the first side 410 is 0.5.

For example, as shown in FIGS. 1 and 4A, the ratio of the length of the first line segment L1 to the length of the remaining portion L2 is 0.25 to 4. For example, the ratio of the length of the first line segment L1 to the length of the remaining portion L2 is 1 to 3. The ratio of the length of the first line segment L1 to the length of the remaining portion L2 is 0.5-2.

For example, as shown in FIGS. 1 to 4A, each spacer 300 is arranged at an interval between a first corner portion 1011 and an opening 210 adjacent to the first corner portion 1011. For example, all the spacers 300 are arranged at intervals close to the first corner portions 1011 to further improve the process yield and the supporting function of the spacers.

For example, as shown in FIGS. 1 to 4A, the number of the openings 210 having the first corner portions 1011 is not smaller than the number of the plurality of spacers 300. For example, the number of the openings 210 having the first corner portions 1011 is greater than the number of the plurality of spacers 300; the spacer 300 is arranged close to part of the openings 210 having the first corner portions 1011 and is not arranged close to the other openings 210. Of course, the embodiment of the present disclosure is not limited to this, and the spacers can also be arranged at a relatively large density. For example, the number of the spacers can be approximately equal to the number of the openings having the first corner portions; for example, the spacer is arranged at the intervals corresponding to the first corner portions of all the openings having the first corner portions.

For example, in the direction of a connecting line between centers of adjacent openings 210, the ratio of the size of the spacer 300 to the size of the interval between the openings 210 may be 0.8-1.2.

For example, the largest size of at least one spacer 300 in a direction parallel to the connecting line C0 is a first size SZ1, wherein the connecting line C0 is between the geometric center of the opening 210 where the first corner portion 1011 is located and the geometric center of the adjacent opening 210; and the largest size of the at least one spacer 300 in a direction perpendicular to the connecting line C0 is a second size SZ2; and the first size SZ1 is smaller than the second size SZ2.

For example, an orthographic projection of at least one spacer 300 on the base substrate 10 has a long strip shape, and a short axis of the long strip shape is approximately parallel to the connecting line C0 between the geometric center of the opening where the first corner portion 1011 is located and the geometric center of the adjacent opening.

FIG. 2 schematically illustrates the case where the orthographic projection of the spacer 300 on the base substrate 10 is a rectangle by way of example, and the long side of the rectangle is the side adjacent to the first corner portion 1011 of the opening 210.

The embodiment of the present disclosure is not limited to the case where the orthographic projection of the spacer on the base substrate has a rectangle shape, for example, the orthographic projection of the spacer on the base substrate can also have a shape which is at least one selected from the group consisted of a rounded rectangle, an ellipse and a circle. For example, the orthographic projection of the spacer on the base substrate can be an axisymmetric graph. For example, the spacer is located at an intersection of portions of the pixel defining layer in different extension directions (for example, the intersection of the portions of the pixel defining layer that cover different extension directions), and has two symmetrical axes which are approximately parallel to the two extension directions of the pixel defining layer where the spacer is located. For example, the size of the orthographic projection of the spacer on the base substrate can range from 20 μm to 50 μm in its long axis direction. For example, the size of the orthographic projection of the spacer on the base substrate can range from 12 μm to 30 μm in its short axis direction. For example, the area of the orthographic projection of the spacer on the base substrate is less than 48 μm*26 μm. For example, the area of the orthographic projection of the spacer on the base substrate is less than 41 μm*25 μm. For example, the area of the orthographic projection of the spacer on the base substrate is less than 33 μm*20 μm. For example, the area of the orthographic projection of the spacer on the base substrate is less than 25 μm*15 μm.

For example, as shown in FIGS. 1 to 4A, an opening 210 having a first corner portion 1011 is configured to define a light-emitting region 101 of at least one color of sub-pixel 100. For example, the at least one color of sub-pixel 100 includes at least one of a blue sub-pixel, a green sub-pixel or a red sub-pixel. FIGS. 1 to 4A schematically show that the opening configured to define the light-emitting region of one color of sub-pixel includes a first corner portion, but it's not limited to this and the opening configured to define the light-emitting region of other colors of sub-pixels may also include the first corner portion, which can be set according to actual product requirements.

Figure 5A:
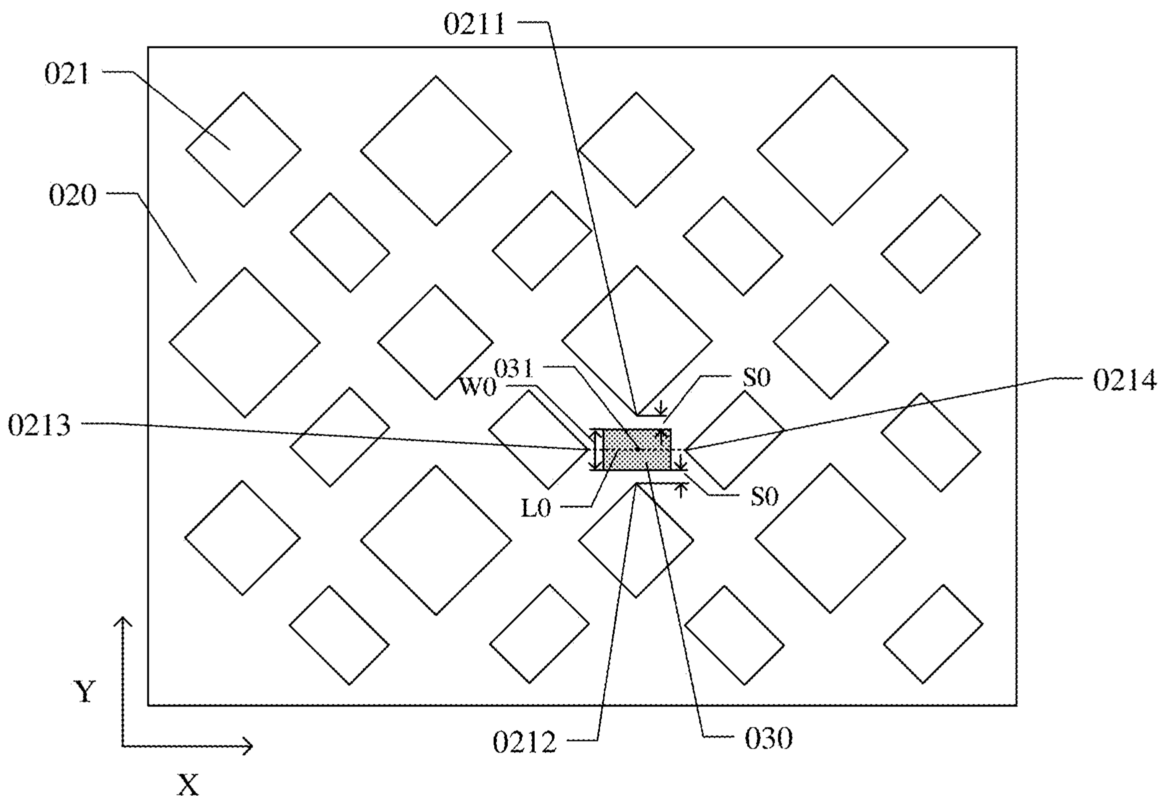
FIG. 5A is a schematic diagram of a planar structure of a pixel defining layer and a spacer.

FIG. 5A is a schematic diagram of a plane structure of a pixel defining layer and a spacer. As shown in FIG. 5A, each of the openings 021 included in one pixel defining layer 020 has a shape of polygon, and the polygon has no vertex angle cut off. The spacer 030 is located at an interval between a vertex angle 0211 and a vertex angle 0212 that are opposite to each other of two adjacent openings 021, and neither the vertex angle 0211 nor the vertex angle 0212 is a rounded angle or a chamfered angle, for example, they may be acute angles or right angles. As shown in FIG. 5A, the distance between the spacer 030 and the vertex angle 0211 can be equal to the distance between the spacer 030 and the vertex angle 0212, for example, the two distances both are S0. FIG. 5A schematically shows that the distance between the spacer 030 and the vertex angle 0211 (or the vertex angle 0212) refers to the distance S0 between the edge of the spacer 030 close to the vertex angle 0211 (or the vertex angle 0212) and the vertex angle 0211 (or the vertex angle 0212), but it's not limited to this and the distance between the spacer and vertex angle can also refer to the distance between the geometric center of the spacer and the vertex angle. As shown in FIG. 5A, a size of the spacer 030 located between the above-mentioned two vertex angles 0211 and 0212 in the Y direction (the arrangement direction of two openings including the above-mentioned vertex angles 0211 and 0212), such as a width, is W0.

Figure 5B:
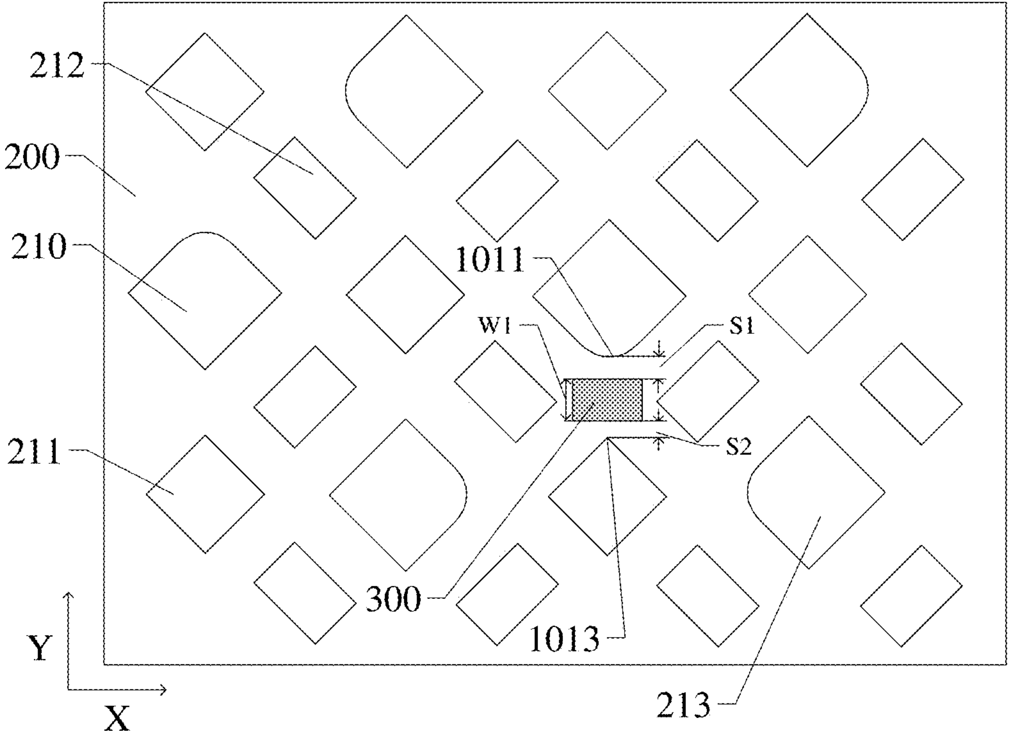
FIG. 5B is a schematic diagram of a partial planar structure of an example of the pixel defining layer and the spacer shown in FIG. 2.

FIG. 5B is a schematic diagram of a partial planar structure of an example of the pixel defining layer and the spacer shown in FIG. 2. As shown in FIG. 5B, a distance between the spacer 300 and the first corner portion 1011 located at one side of the spacer 300 is a first distance S1, and the shortest distance between the spacer 300 and the corner portion 1013 of the opening 210 located at the other side of the spacer 300 is a second distance S2, and the first distance S1 is not less than the second distance S2. For example, the first distance S1 may be greater than the second distance S2. For example, the first distance S1 may be equal to the second distance S2.

For example, the shape of the opening 210 having the corner portion 1013 shown in FIG. 5B and its positional relationship with relative to the spacer 300 can be the as the shape of the opening 021 having the vertex angle 0212 shown in FIG. 5A and its positional relationship with relative to the spacer 030, so the second distance S2 can be equal to the distance S0. The size W1 of the spacer 300 shown in FIG. 5B in the arrangement direction (Y direction) of the two openings 210 and the size W0 of the spacer 030 shown in FIG. 5A in the arrangement direction (Y direction) of the two openings 021 may be approximately equal. The first corner portion 1011 closely adjacent to the spacer 300 shown in FIG. 5B can be formed by cutting off the vertex angle 0211 closely adjacent to the spacer 030 shown in FIG. 5A (the opening 021 where the vertex angle 0211 is located can be a polygon that forms the opening 210 where the first corner portion 1011 is located). As a result, the first distance S1 between the first corner portion 1011 and the spacer 300 shown in FIG. 5B can be greater than the distance S0 between the vertex angle 0211 and the spacer 030 shown in FIG. 5A, and the first distance S1 is greater than the second distance S2, so as to increase the distance between the spacer and one opening, which is beneficial to improving the process yield.

For example, the shapes and relative positional relationships of the openings 212 located at two sides of the spacer 300 in the X direction shown in FIG. 5B may be the same as those of the openings located at two sides of the spacer 030 in the X direction shown in FIG. 5A. For example, as shown in FIG. 5B, when the openings 212 located at two sides of the spacer 300 in the X direction are symmetrically distributed with respect to the connecting line C0, the distances from the spacer 300 to the two openings 212 located at two sides of the spacer 300 in the X direction are equal. For example, both of the openings 212 located at two sides of the spacer 300 in the X direction may or may not include the first corner portion, which is not limited by the embodiment of the present disclosure.

For example, as shown in FIG. 5B, the openings 210 surrounding the spacer 300 include two openings arranged in the row direction and two openings arranged in the column direction. At least one of the above-mentioned four openings 210 includes a first corner portion 1011, for example, one of the above-mentioned four openings includes a first corner portion 1011 facing the spacer 300, and the distance between the spacer 300 and the first corner portion 1011 is a first distance. The distance between the spacer 300 and another opening 210 arranged in the same row or column direction with the opening where the first corner portion 1011 is located is the second distance, and the distances between the spacer 300 and the remaining two openings 210 arranged in the column or row direction is the third distance and the fourth distance respectively. For example, the distances between the spacer 300 and the openings 212 located at two sides of the spacer 300 in the X direction may be the third distance and the fourth distance, respectively, and the third distance and the fourth distance may be equal or different. For example, the first distance may be greater than the third distance; and the second distance, the third distance and the fourth distance may be equal. For example, the first distance is equal to the second distance, the third distance is equal to the fourth distance, and the first distance is greater than the third distance.

For example, when the size W0 of the spacer 030 in FIG. 5A is equal to the size W1 of the spacer 300 in FIG. 5B, the first distance S1 and the second distance S2 can be basically equal by adjusting the distances between the spacer 300 and the two openings 210 located at two sides of the spacer 300 in the Y direction and closely adjacent to the spacer 300 in FIG. 5B, so that the first distance S1 and the second distance S2 are both greater than the distance S0 shown in FIG. 5A. According to the embodiment of the present disclosure, the distances between the spacer and the openings located at two sides of the spacer can be increased by adjusting the distance between the spacer and the opening, which is beneficial to reducing the probability of the spacer falling off and improving the process yield.

Figure 5C:
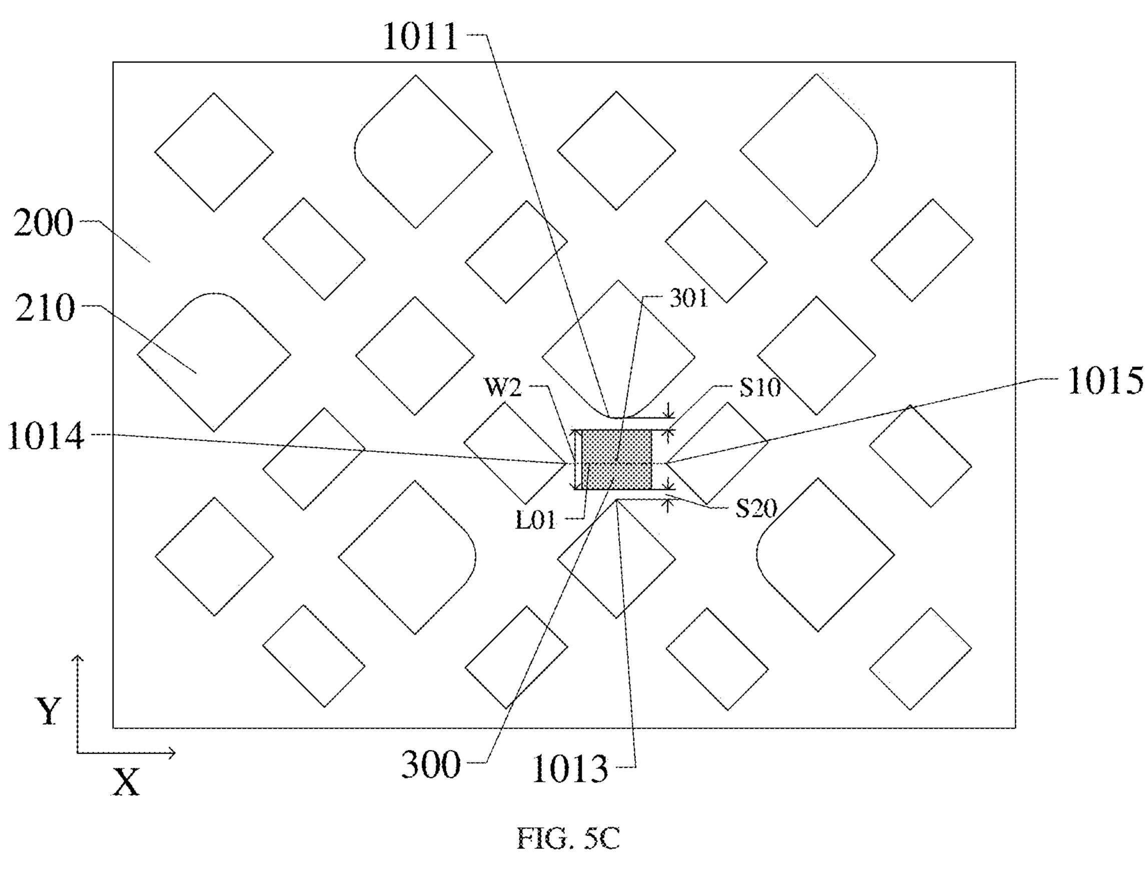
FIG. 5C is a schematic diagram of a partial planar structure of another example of the pixel defining layer and the spacer shown in FIG. 2.

FIG. 5C is a schematic diagram of a partial planar structure of another example of the pixel defining layer and the spacer shown in FIG. 2. As shown in FIG. 5A, the connecting line L0 between the corner portions 0213 and 0214 that are opposite to each other of two openings 021 located at two sides of the spacer 030 in the X direction and closely adjacent to the spacer 030 passes through the geometric center 031 of the spacer 030. As shown in FIG. 5C, the first distance S1 and the second distance S2 between the spacer 300 and the two openings 210 located at two sides of the spacer 300 in the X direction can both be equal to the distance S0 shown in FIG. 5A, and the size W1 (e.g., width) of the spacer 300 in the Y direction shown in FIG. 5C is greater than the size W0 of the spacer 030 in the Y direction shown in FIG. 5A, then the embodiment of the present disclosure improves the supporting function of the spacer on the premise of ensuring process yield, by increasing the size of the spacer without reducing the distance between the spacer and the opening.

In the example shown in FIG. 5C, the opening 210 located at one side of the spacer 300 in the Y direction (or X direction) has the first corner portion 1011, and the opening 210 located at the other side of the spacer 300 in the Y direction (or X direction) doesn't have the first corner portion 1011; while the openings 210 located at two sides of the spacer 300 in the X direction (or Y direction) are symmetrically distributed and may or may not have the first corner portion, and the first corner portions 1011 of the two openings 210 are symmetrically distributed.

For example, as shown in FIG. 5C, the connecting line L01 of the corner portions 1014 and 1015 opposite to each other of two openings 210 that are located at two sides of the spacer 300 in at least one of the row direction or the column direction and are closely adjacent to the spacer 300 is located at the side of the geometric center 301 of the spacer 300 away from the first corner portion 1011.

For example, the first distance, the second distance, the third distance and the fourth distance may be equal to each other.

Of course, the embodiment of the present disclosure is not limited to the sizes of the spacer and the settings of the distances between the spacer and the openings as described above. For example, the size W1 of the spacer 300 shown in FIG. 5B can also be larger than the size W0 of the spacer 030 shown in FIG. 5A, and the distance (at least one of the first distance or the second distance) between the spacer 300 and at least one opening shown in FIG. 5B is also larger than the distance S0 between the spacer 030 and the opening shown in FIG. 5A. By increasing the size of the spacer and increasing the distance between the spacer and the opening at the same time, it is not only beneficial to reducing the probability for the spacer to fall off, but also beneficial to improving the process yield of products and improving the supporting function of the spacer.

Referring to FIGS. 5A to 5C, because at least one opening is provided with a first corner portion, the distance between the first corner portion and a corner portion located in an adjacent opening and opposite to the first corner portion is increased. At this time, both the size of the spacer and the distance between the spacer and the opening can be increased, which can reduce the probability for the spacer to fall off, and is beneficial to improving the process yield of products and improving the supporting function of the spacer.

Figure 6:
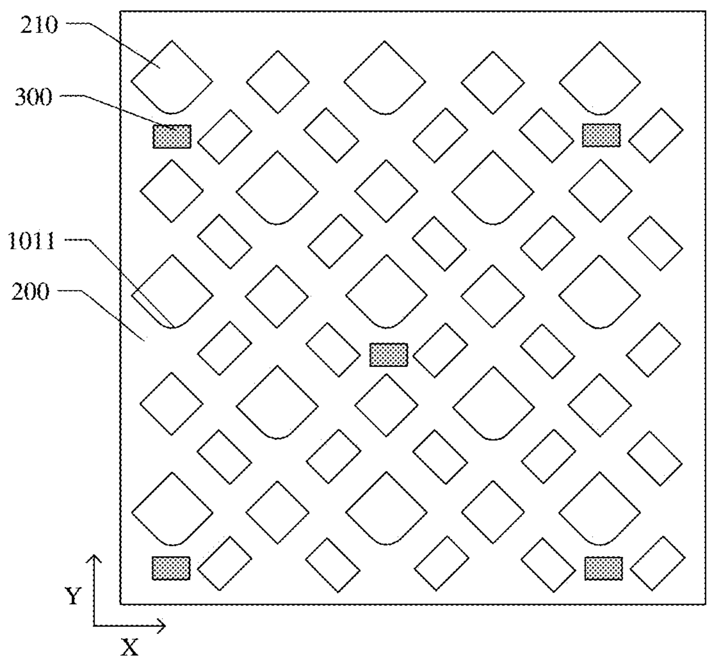
FIG. 6 is a schematic diagram of a planar structure of a pixel defining layer and a spacer provided according to another example of an embodiment of the present disclosure.

For example, FIG. 6 is a schematic plan view of a pixel defining layer and a spacer provided according to another example of an embodiment of the present disclosure. As shown in FIG. 6, for example, the openings 210 having the first corner portions 1011 include the same type of openings. For example, the openings 210 having the first corner portions 1011 may each include one first corner portion 1011, and the first corner portions 1011 in respective openings 210 have the same orientation, for example, the first corner portions 1011 in respective openings 210 all face upwards, or all face downwards, or all face rightwards, or all face leftwards, or all face (obliquely) to the upper left, or all face (obliquely) to the lower left, or all face (obliquely) to the upper right, or all face (obliquely) to the lower right, then a plurality of spacers 300 are distributed at the intervals corresponding to the first corner portions 1011 with the same orientation. The above-mentioned "the same type of openings" refers to the openings in which the corner portions have the same orientation, and the same type of openings may include only the openings configured to define the light-emitting regions of the same color of sub-pixels or the openings configured to define the light-emitting regions of different colors of sub-pixels. For example, the same type of openings may only include an opening that defines the light-emitting region of a blue sub-pixel, or an opening that defines the light-emitting region of a green sub-pixel, or an opening that defines the light-emitting region of a red sub-pixel; it may also include an opening that defines the light-emitting region of a blue sub-pixel and an opening that defines the light-emitting region of a green sub-pixel, or an opening that defines the light-emitting region of a blue sub-pixel and an opening that defines the light-emitting region of a red sub-pixel, or an opening that defines the light-emitting region of a green sub-pixel and an opening that defines the light-emitting region of a red sub-pixel; it may also include an opening that defines a light-emitting region of a blue sub-pixel, an opening that defines a light-emitting region of a red sub-pixel, and an opening that defines a light-emitting region of a green sub-pixel.

FIG. 6 schematically shows that the opening configured to define the light-emitting region of one color of sub-pixel includes a first corner portion, but it is not limited to this, and the openings configured to define the light-emitting regions of other colors of sub-pixels may also include the first corner portion, which can be set according to actual product requirements.

For example, as shown in FIGS. 1 to 4A, the openings 210 that have the first corner portions 1011 and are configured to define light-emitting regions 101 of sub-pixels 100 of the same color include at least two types of openings; and in different types of openings 210, the vertex of the first corner portion 1011 points to the vertex of the corner portion opposite to the first corner portion 1011 in different directions.

In the embodiment of the present disclosure, "different types of openings" refer to that, the openings having different directions in which the vertex of a corner portion points to the vertex of an opposite corner portion. For example, the above-mentioned opening may include four corner portions, in which case the opening may include one first corner portion, and one of the other three corner portions is opposite to the first corner portion. The above-mentioned opening may also include two first corner portions and two other corner portions, each of the two first corner portions is opposite to corresponding one other corner portion, in which case the two corner portions are adjacent corner portions, and one of the two corner portion is used as a reference corner portion to determine different types of openings depending on the relative positional relationship of the two corner portions, and the direction that the reference corner portion points to the opposite corner portion is used as a reference direction. The above-mentioned opening may also include three first corner portions and one other corner portion, and the first corner portion opposite to the one other corner portion is used as the reference corner portion to determine different types of openings, and the direction that the reference corner portion points to the opposite corner portion is used as the reference direction.

Figure 7:
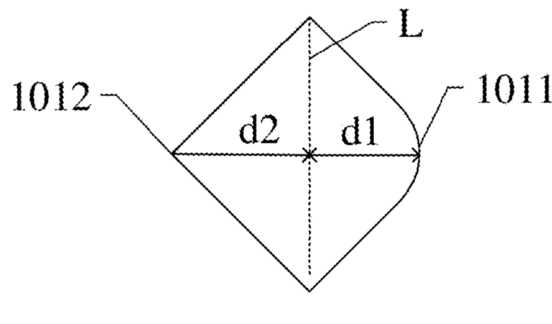
FIG. 7 is an enlarged view of an opening shown in FIG. 2.

For example, FIG. 7 is an enlarged view of an opening shown in FIG. 2. As shown in FIG. 2 and FIG. 7, in at least one opening 210, a connecting line L of vertices of the other two corner portions except the first corner portion 1011 used as the reference corner portion and the corner portion opposite to the first corner portion 1011 divides the opening 210 into two parts, one part is where the first corner portion 1011 is located, and the other part is where the corner portion 1012 (for example, the second corner portion 1012) opposite to the first corner portion 1011 is located. For example, the ratio of the area of the part where the first corner portion 1011 is located to the area of the part where the second corner portion 1012 is located may be 0.1 to 0.99. For example, the ratio of the area of the part where the first corner portion 1011 is located to the area of the part where the second corner portion 1012 is located may be 0.2 to 0.9. For example, the ratio of the area of the part where the first corner portion 1011 is located to the area of the part where the second corner portion 1012 is located may be 0.3 to 0.8. For example, the ratio of the area of the part where the first corner portion 1011 is located to the area of the part where the second corner portion 1012 is located may be 0.4 to 0.7.

For example, as shown in FIG. 7, a distance d1 between the vertex of the first corner portion 1011 and the connecting line L is smaller than a distance d2 between the vertex of the second corner portion 1012 and the connecting line L. For example, the ratio of the distance d1 between the vertex of the first corner portion 1011 and the connecting line L to the distance d2 between the vertex of the second corner portion 1012 and the connecting line L is d1/d2, which can range from 0.1 to 0.9. For example, d1/d2 can range from 0.2 to 0.8. For example, d1/d2 can range from 0.4 to 0.6. For example, the ratio of d1 to d2 may range from 0.7 to 0.9.

For example, as shown in FIG. 7, the length of a connecting line between the vertex of the first corner portion 1011 and the vertex of the second corner portion 1012 can be a (that is, the sum of the distance d1 and the distance d2 described above), the length of the connecting line L can be b, and the ratio of a to b can range from 0.6 to 0.9. For example, the ratio of a to b can range from 0.7 to 0.8.

For example, as shown in FIG. 2, because the first corner portion 1011 can be orientated upwards, downwards, leftwards, rightwards, obliquely upwards to the left, obliquely downwards to the left, obliquely upwards to the right or obliquely downwards to the right, the direction in which the vertex of the first corner portion 1011 points to the vertex of the corner portion opposite to the first corner portion 1011 can also include multiple directions. For example, in at least two types of openings 210, the direction in which the vertex of the first corner portion 1011 points to the vertex of the corner portion opposite to the first corner portion 1011 can include at least two of a direction D1, a direction D2, a direction D3 or a direction D4 which are different from each other. For example, in at least two types of openings 210, the directions in which the vertices of the first corner portions 1011 point to the vertices of the corner portions opposite to the first corner portions 1011 may be parallel and opposite to each other, and may also be intersected with each other.

For example, as shown in FIGS. 1 to 4A, at least part of the plurality of spacers 300 are distributed at the intervals corresponding to the same type of openings. For example, the spacers 300 distributed at the intervals corresponding to the same type of openings are uniformly distributed, which is beneficial to reducing the difficulty of the manufacturing process of spacers.

For example, as shown in FIG. 2, at least two types of openings 210 include at least two of a first type of opening 1001, a second type of opening 1002, a third type of opening 1003 or a fourth type of opening 1004. For example, as shown in FIG. 2, the direction in which the vertex of the first corner portion 1011 points to the vertex of the corner portion opposite thereto in the first type of opening 1001 can be the direction D2, the direction in which the vertex of the first corner portion 1011 points to the vertex of the corner portion opposite thereto in the second type of opening 1002 can be the direction D3, the direction in which the vertex of the first corner portion 1011 points to the vertex of the corner portion opposite thereto in the third type of opening 1003 can be the direction D4, and the direction in which the vertex of the first corner portion 1011 points to the vertex of the corner portion opposite thereto in the fourth type of opening 1004 can be the direction D1. For example, at least part of the plurality of spacers 300 can be uniformly distributed at the intervals corresponding to the first type of openings 1001; alternatively, at least part of the plurality of spacers 300 can be uniformly distributed at the intervals corresponding to the second type of openings 1002; alternatively, at least part of the plurality of spacers 300 can be uniformly distributed at the intervals corresponding to the third type of openings 1003; alternatively, at least part of the plurality of spacers 300 can be uniformly distributed at the intervals corresponding to the fourth type of openings 1004.

For example, as shown in FIG. 2, orientations of first corner portions 1011 in two types of openings selected from the group consisted of the first type of opening 1001, the second type of opening 1002, the third type of opening 1003 and the fourth type of opening 1004 are opposite to each other, and orientations of first corner portions 1011 in the other two types of openings are opposite to each other. For example, if the direction D1 of the fourth type of opening 1004 is opposite to the direction D4 of the third type of opening 1003, the orientation of the first corner portion 1011 in the fourth type of opening 1004 is opposite to that in the third type of opening 1003. For example, if the direction D2 of the first type of opening 1001 is opposite to the direction D3 of the second type of opening 1002, the orientation of the first corner portion 1011 in the first type of opening 1001 is opposite to that in the second type of opening 1002. The embodiment of the present disclosure does not limit the names of the above-described four types of openings, and the above-mentioned names that "first type of opening", "second type of opening", "third type of opening" and "fourth type of opening" can be interchanged.

Figure 8A:
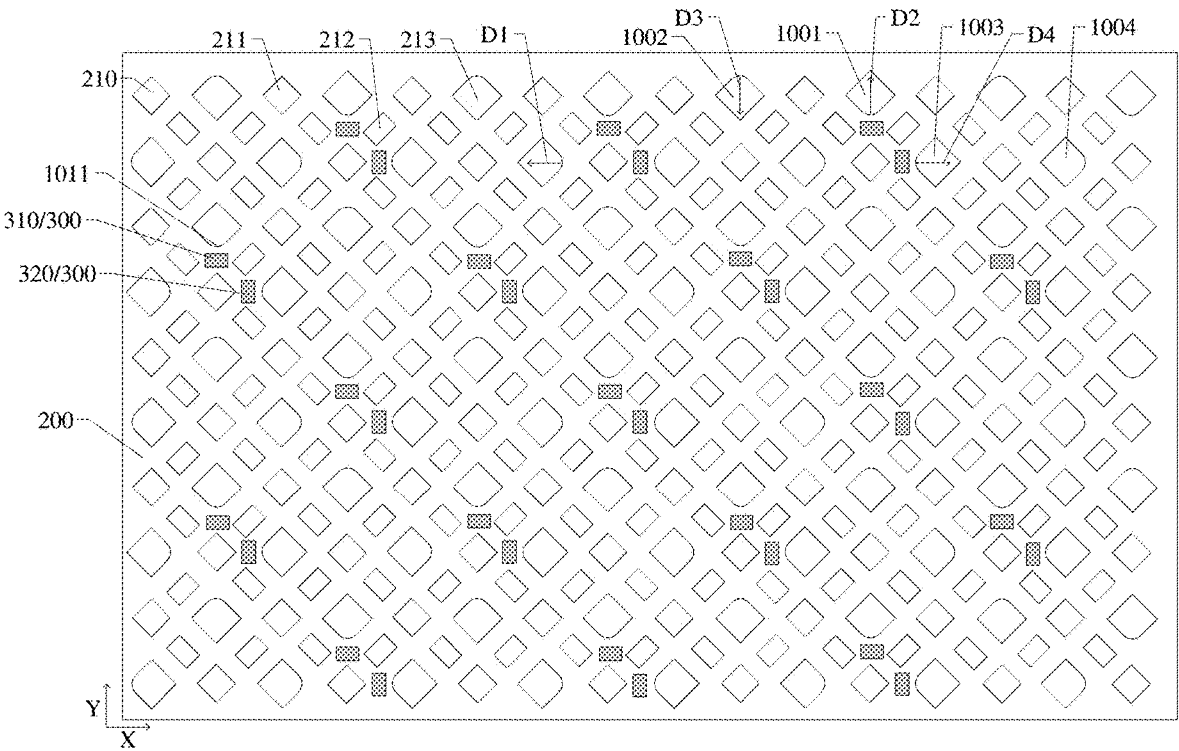
FIG. 8A is a schematic diagram of a planar structure of a pixel defining layer and a spacer provided according to another example of an embodiment of the present disclosure.

For example, FIG. 8A is a schematic plan view of a pixel defining layer and a spacer provided according to another example of an embodiment of the present disclosure. As shown in FIG. 8A, the plurality of spacers 300 include a plurality of first spacers 310, which are distributed at the intervals corresponding to the first corner portions 1011 of the same type of openings and are uniformly distributed.

For example, FIG. 8A schematically shows that a plurality of first spacers 310 are distributed at the intervals corresponding to the first corner portions 1011 of at least part of the first type of openings 1001, but it is not limited to this. The plurality of first spacers 310 may also be distributed at the intervals corresponding to the first corner portions 1011 of other types of openings (such as the second type of openings 1002, the third type of openings 1003 or the fourth type of openings 1004). Of course, the embodiment of the present disclosure is not limited to the case where the first spacers are distributed at the intervals corresponding to the corner portions of the same type of openings. For example, a part of the first spacers can be distributed at the intervals corresponding to the corner portions of one type of openings, and another part of the first spacers can be distributed at the intervals corresponding to the corner portions of at least one type of other types of openings, as long as these first spacers are arranged regularly.

For example, as shown in FIG. 8A, the plurality of spacers 300 further include a plurality of second spacers 320 which are distributed at the intervals corresponding to at least part of the first corner portion 1011 of the second type of opening 1002 and are uniformly distributed. The embodiment of the present disclosure schematically shows that the second type of opening 1002 is an opening having the first corner portion 1011 facing leftwards, but it is not limited to this, and the second type of opening may also be an opening having the corner portion facing upwards, downwards or rightwards, which is not limited by the embodiment of the present disclosure.

For example, as shown in FIG. 8A, the first spacer 310 and the second spacer 320 may both be long strips, and the long sides of the long strips of the first spacer 310 and the second spacer 320 may be parallel to each other or intersected with each other, which is not limited by the embodiment of the present disclosure.

For example, the number of the first spacer 310 may be the same as or different from the number of the second spacer 320. For example, the ratio of the number of the first spacer 310 to the number of the second spacer 320, or the ratio of the number of the second spacer 320 to the number of the first spacer 310 can be 0.1-1, or 0.2-0.9, or 0.3-0.8, or 0.4-0.7, or 0.5-0.6.

For example, as shown in FIGS. 2 and 8A, the number of the spacer(s) 300 adjacent to one opening 210 may be one or two. For example, when the number of the spacers 300 adjacent to one opening 210 is two, these two spacers 300 can be located at the intervals corresponding to two adjacent corner portions of the opening 210 or at the intervals corresponding to two opposite corner portions of the opening 210, which is not limited by the embodiment of the present disclosure.

The embodiment of the present disclosure is not limited to this. For example, the number of the spacers adjacent to one opening can also be three or four, which can be set according to actual product requirements.

The embodiment of the present disclosure is not limited to the case where the spacers include only the first spacers and the second spacers. For example, the spacers may also include third spacers, which may be distributed at the intervals corresponding to the first corner portions of the third type of openings or the fourth type of openings, for example, the third spacers may be uniformly distributed; for example, the spacers can also include fourth spacers, which can be distributed at the intervals corresponding to the first corner portions of the remaining one type of openings, for example, the fourth spacers can be uniformly distributed.

For example, the spacers can be randomly distributed at the intervals corresponding to the first corner portions, and are regularly distributed. Here, "regularly distributed" can refer to that the spacers are distributed at substantially equal intervals in the row direction, for example, there are four openings (not limited to four openings, but also two or six, etc.) between any two adjacent spacers. The spacers are also distributed at substantially equal intervals in the column direction, for example, there are four openings (not limited to four, but also two or six, etc.) between any two adjacent spacers.

For example, the shape and size of the first spacer 310 may be the same as or different from those of the second spacer 320. FIG. 8A schematically shows that the shape and size of the first spacer 310 are the same as the shape and size of the second spacer 320; that is, all the spacer 300 have the same shape and the same size. In the embodiment of the present disclosure, the shape of the spacer may refer to the shape of the orthographic projection of the spacer on the base substrate; and the size of the spacer may refer to the area of the orthographic projection of the spacer on the base substrate.

Figure 8B:
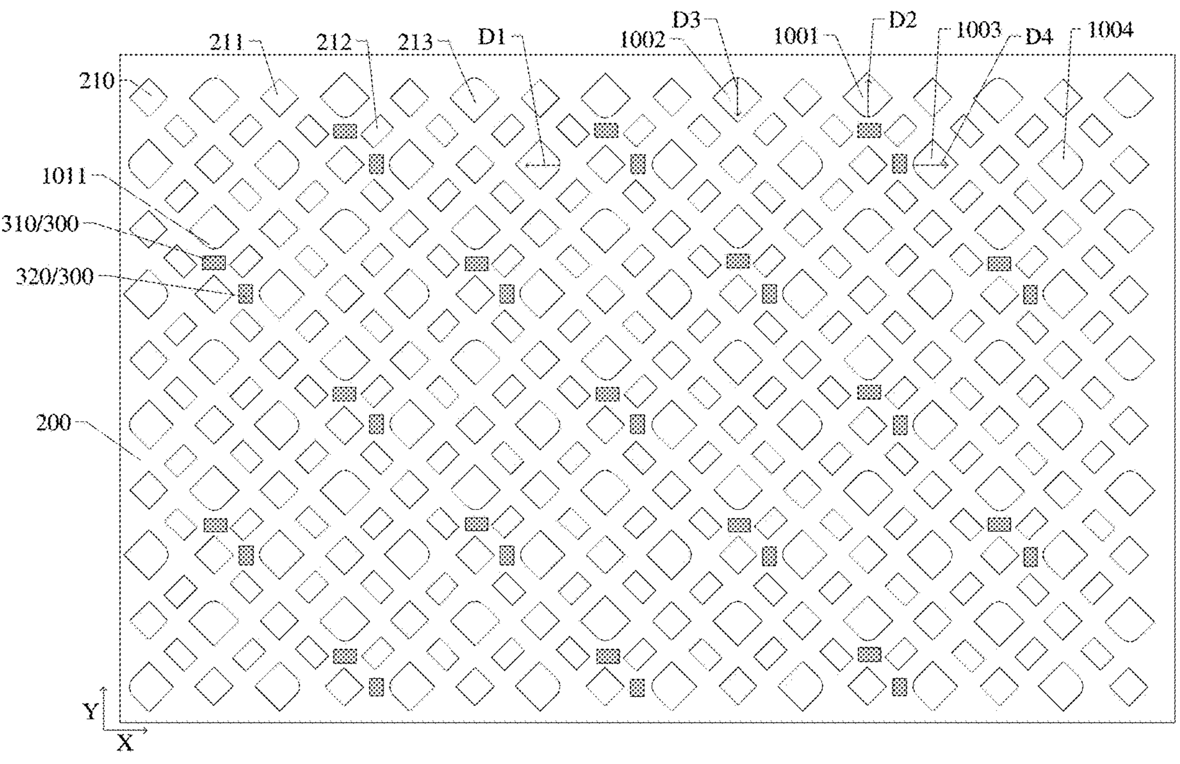
FIG. 8B is a schematic diagram of a planar structure of a pixel defining layer and a spacer provided according to another example of an embodiment of the present disclosure.

For example, FIG. 8B is a schematic plan view of a pixel defining layer and a spacer provided according to another example of an embodiment of the present disclosure. The example shown in FIG. 8B is different from the example shown in FIG. 8A in that, at least part of the spacers are different in their sizes. For example, the first spacer 310 and the second spacer 320 have different shapes and different sizes. For example, the first spacer 310 and the second spacer 320 have the same shape but different sizes.

For example, the spacer 300 may include a largest size in any one direction, and the spacers have the largest size in different extension directions will have different areas. For example, the area of the spacer 300 located at the interval corresponding to the first corner portion 1011 is different from the area of the spacer located at the interval not corresponding to the first corner portion.

The embodiment of the present disclosure does not limit the shapes of the first spacer and the second spacer. For example, the shapes of the first spacer and the second spacer can also be regular shapes such as circle, ellipse, diamond and square, or irregular shapes, which can be set according to the actual product requirements.

Figure 8C:
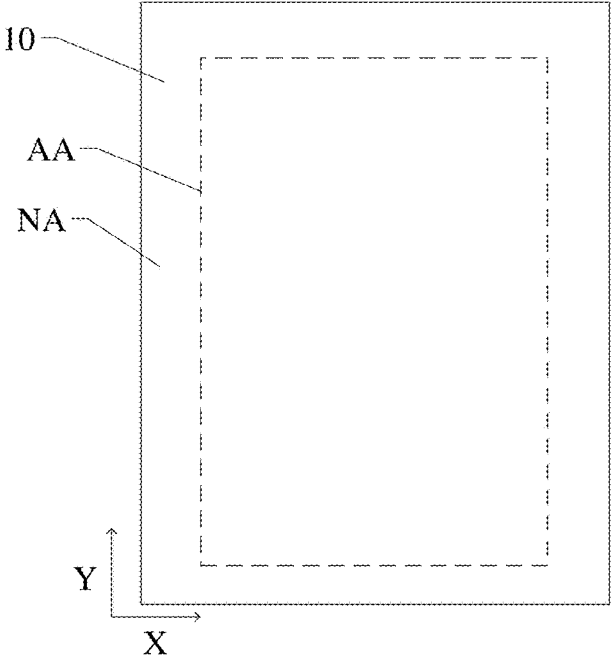
FIG. 8C is a schematic plan view of a display substrate.

FIG. 8C is a schematic plan view of a display substrate. As shown in FIGS. 2 and 8A to 8C, the display substrate includes a display area AA and a non-display area NA surrounding the display area AA. FIGS. 2 and 3 show a part of the display area. For example, the plurality of sub-pixels 100 are located in the display area AA, and at least part of the plurality of spacers 300 are located in the display area AA. For example, the spacers 300 in the display area AA may include spacers each located at the interval between the first corner portion 1011 and the opening 210 adjacent to the first corner portion 1011, and the spacers located at other positions; and the ratio of the number of the spacers 300 each located at the interval between the first corner portion 1011 and the opening 210 adjacent to the first corner portion 1011 to the number of the spacers 300 located in the display area AA is not less than 50%.

For example, the ratio of the number of the spacers 300 each located at the interval between the first corner portion 1011 and the opening 210 adjacent to the first corner portion 1011 to the number of the spacers 300 located in the display area AA is not less than 60%. For example, the ratio of the number of the spacers 300 each located at the interval between the first corner portion 1011 and the opening 210 adjacent to the first corner portion 1011 to the number of the spacers 300 located in the display area AA is not less than 70%. For example, the ratio of the number of the spacers 300 each located at the interval between the first corner portion 1011 and the opening 210 adjacent to the first corner portion 1011 to the number of the spacers 300 located in the display area AA is not less than 80%. For example, the ratio of the number of the spacers 300 each located at the interval between the first corner portion 1011 and the opening 210 adjacent to the first corner portion 1011 to the number of the spacers 300 located in the display area AA is not less than 90%.

For example, as shown in FIGS. 2 and 8A, the openings 210 include openings configured to define sub-pixels of different colors; for example, in at least one of a row direction, a column direction or an oblique direction, two adjacent openings 210 are configured to define light-emitting regions of sub-pixels of different colors. For example, the openings configured to define sub-pixels of different colors may include a first opening 211, a second opening 212, and a third opening 213; one of the first opening 211, the second opening 212 and the third opening 213 is configured to define the light-emitting region of the red sub-pixel, another one is configured to define the light-emitting region of the blue sub-pixel, and the remaining opening is configured to define the light-emitting region of the green sub-pixel.

For example, as shown in FIGS. 2 and 8A, at least part of the spacers 300 are distributed at the intervals between first corner portions 1011 of openings 210 configured to define sub-pixels of different colors and openings 210 adjacent to the first corner portions 1011. For example, the spacer 300 may be distributed at the interval between the first corner portion 1011 of the third opening 213 and the first opening 211.

For example, the spacer 300 can also be distributed between two openings 210 defining sub-pixels of the same color, for example, the spacer 300 is distributed between two second openings 211, and the corner portion of the second opening 211 that faces the spacer 300 may be or may not be the first corner portion, which is not limited by the embodiment of this disclosure.

Figure 9:
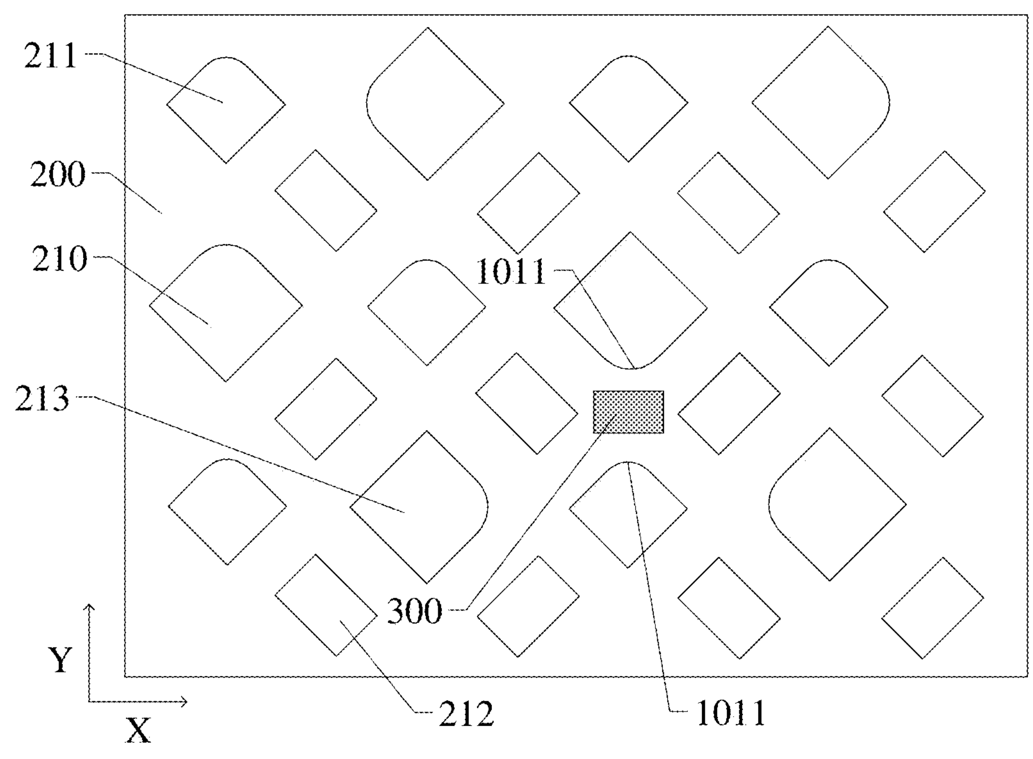
FIG. 9 is a schematic diagram of a planar structure of a pixel defining layer and a spacer provided according to another example of an embodiment of the present disclosure.

For example, FIG. 9 is a schematic plan view of a pixel defining layer and a spacer provided according to another example of an embodiment of the present disclosure. As shown in FIG. 9, at least two openings 210 closely adjacent to at least one spacer 300 each include a first corner portion 1011, and the first corner portions 1011 of at least two openings 210 all face the spacer 300.

For example, as shown in FIG. 9, the first opening 211 and the third opening 213 both include the first corner portion 1011, and the first corner portions 1011 of the two openings 210 both face the spacer 300 located between the two openings 210, so as to further increase the distance between the corner portions opposite to each other of the two openings located at two sides of the spacer, thereby not only increasing the size of the spacer, but also increasing the distance between the spacer and the opening. It's beneficial to reducing the probability for the spacer to fall off, and is beneficial to improving the process yield of products and improving the supporting function of the spacer.

The embodiment of the present disclosure is not limited to the case where at least two openings 210 (the first opening 211 and the third opening 213 shown in FIG. 9) closely adjacent to the spacer 300 each include the first corner portion 1011, and the first corner portions 1011 of the at least two openings 210 all face the spacer 300. For example, three openings closely adjacent to the spacer 300, including the first opening 211, the third opening 213 and the second opening 212, each include the first corner portion 1011, and the first corner portions 1011 of the three openings 210 all face the spacer 300. For example, three openings 210 closely adjacent to the spacer 300, including two second openings 212 and one first opening 211 or one third opening 213, each include the first corner portion, and the first corner portions 1011 of the three openings 210 all face the spacer 400. For example, four openings closely adjacent to the spacer 300, including the first opening 211, the third opening 213 and two second openings 212, each include the first corner portion 1011, and the first corner portions 1011 of the four openings 210 all face the spacer 300.

For example, as shown in FIGS. 1 to 9, the display substrate includes a plurality of sub-pixels 100. As shown in FIG. 1, the plurality of sub-pixels 100 include a plurality of first color sub-pixels 110, a plurality of second color sub-pixels 120 and a plurality of third color sub-pixels 130. The plurality of first color sub-pixels 110 and the plurality of third color sub-pixels 130 are alternately arranged along the row direction (the X direction as shown in FIG. 1) to form a first pixel row 01; the plurality of second color sub-pixels 120 are arranged along the row direction to form a second pixel row 02; the first pixel row 01 and the second pixel row 02 are alternately arranged along the column direction (the Y direction as shown in FIG. 1) crossed with the row direction, and are staggered from each other in the row direction. For example, adjacent first color sub-pixel 110 and second color sub-pixel 120 are arranged along a first direction, which intersects with both the row direction and the column direction. As shown in FIG. 1, a plurality of first color sub-pixels 110 and a plurality of third color sub-pixels 130 are alternately arranged along the column direction to form a plurality of first pixel columns 03; a plurality of second color sub-pixels 120 are arranged in an array along both the row direction and the column direction to form a plurality of second pixel rows 02 and a plurality of second pixel columns 04; the plurality of first pixel columns 03 and the plurality of second pixel columns 04 are alternately arranged along the row direction and staggered from each other in the column direction. That is to say, the second pixel row 02 where one second color sub-pixel 120 is located is located between two adjacent first pixel rows 01, and the second pixel column 04 where the second color sub-pixel 120 is located is located between two adjacent first pixel columns 03.

In the embodiment of the present disclosure, both the row direction and the column direction refer to the arrangement direction of the first color sub-pixel and the third color sub-pixel, which direction may be or may not be parallel to the direction of a connecting line between geometric centers of the light-emitting regions of two adjacent sub-pixels. For example, the row direction intersects with the column direction. For example, an included angle between the row direction and the column direction may be 80 degrees to 100 degrees. For example, the included angle between the row direction and the column direction may be 85 degrees to 95 degrees. For example, the row direction and the column direction may be perpendicular to each other, but it's not limited to this, and the two directions may not be perpendicular to each other. In the embodiment of the present disclosure, the row direction and the column direction can be interchanged.

The sub-pixel in the embodiment of the present disclosure refers to a light-emitting device structure, and the first color sub-pixel, the second color sub-pixel and the third color sub-pixel are sub-pixels emitting light of different colors. The embodiment of the present disclosure describes the case where the first color sub-pixel is a red sub-pixel, the second color sub-pixel is a green sub-pixel and the third color sub-pixel is a blue sub-pixel by way of example. However, the case where the first color sub-pixel is a red sub-pixel, the second color sub-pixel is a green sub-pixel and the third color sub-pixel is a blue sub-pixel does not limit the scope of protection of the embodiment of the present disclosure.

For example, the area of the light-emitting region of at least one blue sub-pixel is larger than the area of the light-emitting region of at least one red sub-pixel, and the area of the light-emitting region of at least one red sub-pixel is larger than the area of the light-emitting region of at least one green sub-pixel, so as to prolong the service life of the display substrate. For example, the areas of light-emitting regions of sub-pixels of the same color are basically the same.

For example, as shown in FIGS. 1 to 9, the plurality of openings 210 of the pixel defining layer 200 include a plurality of first openings 211, a plurality of second openings 212, and a plurality of third openings 213; the plurality of first openings 211 are configured to define the light-emitting regions 101 of the plurality of first color sub-pixels 110, the plurality of second openings 212 are configured to define the light-emitting regions 101 of the plurality of second color sub-pixels 120, and the plurality of third openings 213 are configured to define the light-emitting regions 101 of the plurality of third color sub-pixels 130.

For example, as shown in FIGS. 1 to 9, at least one of the first opening 211, the second opening 212 or the third opening 213 includes a first corner portion 1011.

For example, FIG. 2 schematically shows that only the third opening 213 includes the first corner portion 1011, and FIG. 9 schematically shows that both the first opening 211 and the third opening 213 include the first corner portion 1011, and the embodiment of the present disclosure is not limited to this. For example, the first opening, the second opening and the third opening all include the first corner portion; or the first opening and the second opening include the first corner portion; or the second opening and the third opening include the first corner portion; or only the first opening includes the first corner portion; or only the second opening includes the first corner portion.

For example, as shown in FIG. 2, FIG. 6 and FIG. 8A, at least part of the plurality of spacers 300 are distributed at the intervals between two adjacent openings 210 arranged along at least one of the column direction or the row direction.

For example, the spacer 300 may be distributed between two second openings 212 arranged in the row direction, and distributed between the first opening 211 and the third opening 213 arranged in the column direction. For example, the spacer 300 may be distributed between two second openings 212 arranged in the column direction, and distributed between the first opening 211 and the third opening 213 arranged in the row direction. For example, the openings 210 surrounding the spacer 300 may include one first opening 211, one third opening 213 and two second openings 212; the first opening 211 and the third opening 213 may be arranged in one direction of the row direction and the column direction, and the two second openings 212 may be arranged in the other direction of the row direction and the column direction. Similarly, the sub-pixels 100 surrounding the spacer 300 may include one first color sub-pixel 110, one third color sub-pixel 130 and two second color sub-pixels 120; the first color sub-pixel 110 and the third color sub-pixel 130 may be arranged along one direction of the row direction and the column direction, and the two second color sub-pixels 120 may be arranged along the other direction of the row direction and the column direction.

For example, as shown in FIGS. 1 and 2, four second color sub-pixels 120 are arranged between adjacent spacers 300 along one direction of the row direction and the column direction; and two first color sub-pixels 110 and two third color sub-pixels 130 are arranged between adjacent spacers 300 along the other direction of the row direction and the column direction. For example, four second openings 212 are arranged between adjacent spacers 300 along one direction of the row direction and the column direction; and two first openings 211 and two third openings 213 are arranged between adjacent spacers 300 along the other direction of the row direction and the column direction.

Figure 10A:
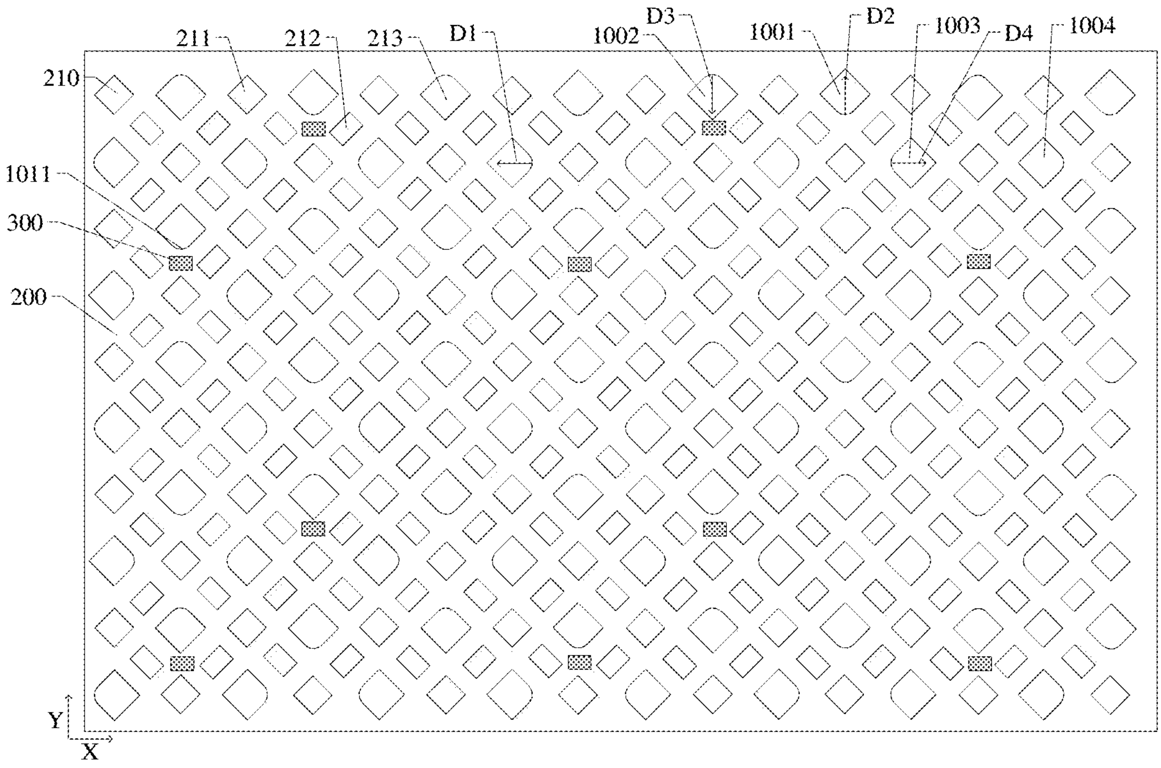
FIG. 10A is a schematic diagram of a planar structure of a pixel defining layer and a spacer provided according to another example of an embodiment of the present disclosure.

For example, FIG. 10A is a schematic plan view of a pixel defining layer and a spacer provided according to another example of an embodiment of the present disclosure. As shown in FIGS. 1 and 10A, six second color sub-pixels 120 are arranged between adjacent spacers 300 along one direction of the row direction and the column direction; and three first color sub-pixels 110 and three third color sub-pixels 130 are arranged between adjacent spacers 300 along the other direction of the row direction and the column direction. For example, six second openings 212 are arranged between adjacent spacers 300 along one direction of the row direction and the column direction; and three first openings 211 and three third openings 213 are arranged between adjacent spacers 300 along the other direction of the row direction and the column direction. It is schematically shown in the figures that part of the spacers 300 are located at the intervals corresponding to the first corner portions 1011, and part of the spacers 300 are not located at the intervals corresponding to the first corner portions 1011, and the embodiment of the present disclosure is not limited to this. For example, by adjusting the orientations of the first corner portions of the openings, all the spacers can be located at the intervals corresponding to the first corner portions. For example, the orientations of the first corner portions 1011 of all the third openings 213 can be adjusted to face downwards, so that all the spacers can be located at the intervals corresponding to the first corner portions 1011. For example, the orientations of the first corner portions 1011 of all the first openings 211 can be adjusted to face upwards, so that all the spacers are located at the intervals corresponding to the first corner portions 1011. For example, a first corner portion 1011 facing rightwards or leftwards can also be provided in the second opening 212, so that all the spacers are located at the intervals corresponding to the first corner portions 1011.

Figure 10B:
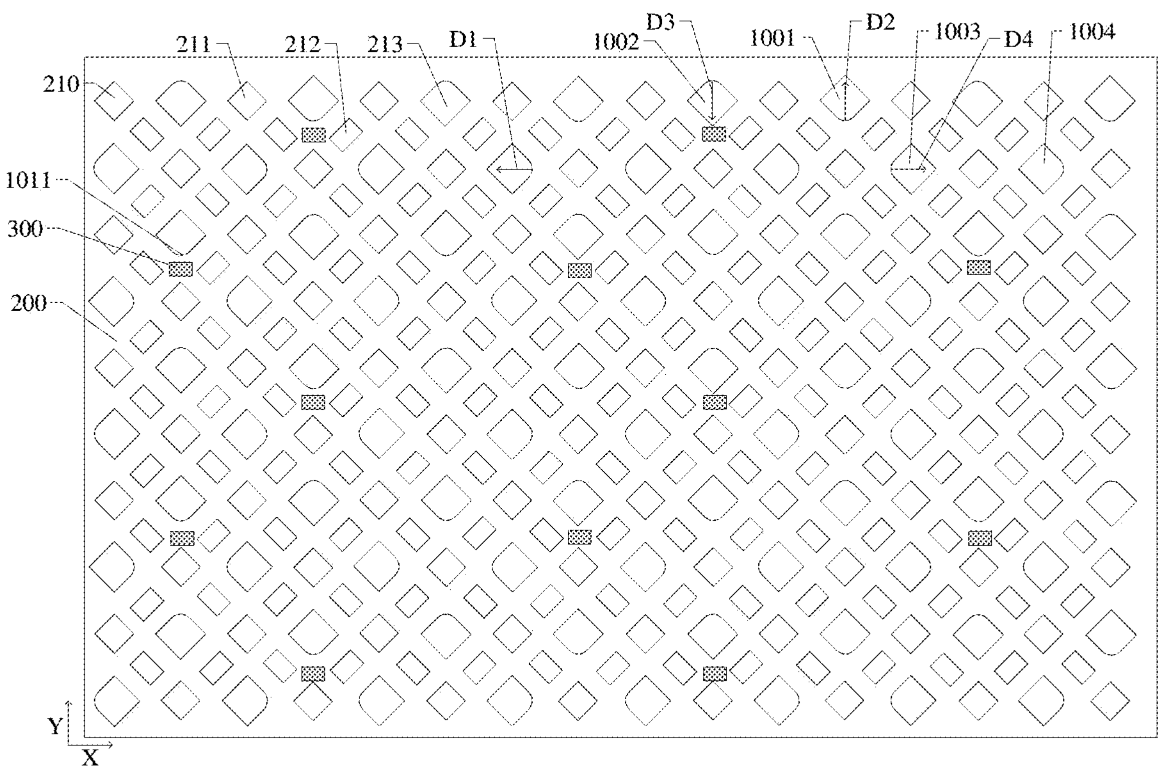
FIG. 10B is a schematic diagram of a planar structure of a pixel defining layer and a spacer provided according to another example of an embodiment of the present disclosure.

For example, FIG. 10B is a schematic plan view of a pixel defining layer and a spacer provided according to another example of an embodiment of the present disclosure. As shown in FIGS. 1 and 10B, six second color sub-pixels 120 are arranged between adjacent spacers 300 along one direction of the row direction and the column direction; and two first color sub-pixels 110 and two third color sub-pixels 130 are arranged between adjacent spacers 300 along the other direction of the row direction and the column direction. For example, six second openings 212 are arranged between adjacent spacers 300 along one direction of the row direction and the column direction; and two first openings 211 and two third openings 213 are arranged between adjacent spacers 300 along the other direction of the row direction and the column direction. It is schematically shown in the figures that part of the spacers 300 are located at the intervals corresponding to the first corner portions 1011, and part of the spacers 300 are not located at the intervals corresponding to the first corner portions 1011, and the embodiment of the present disclosure is not limited to this. For example, by adjusting the orientations of the first corner portions of the openings, all the spacers can be located at the intervals corresponding to the first corner portions. For example, the orientations of the first corner portions 1011 of all the third openings 213 can be adjusted to face downwards, so that all the spacers 300 can be located at the intervals corresponding to the first corner portions 1011. For example, the orientations of the first corner portions 1011 of all the first openings 211 can be adjusted to face upwards, so that all the spacers 300 are located at the intervals corresponding to the first corner portions 1011. For example, a first corner portion 1011 facing rightwards or leftwards can also be provided in the second opening 212, so that all the spacers 300 are located at the intervals corresponding to the first corner portions 1011.

Figure 10C:
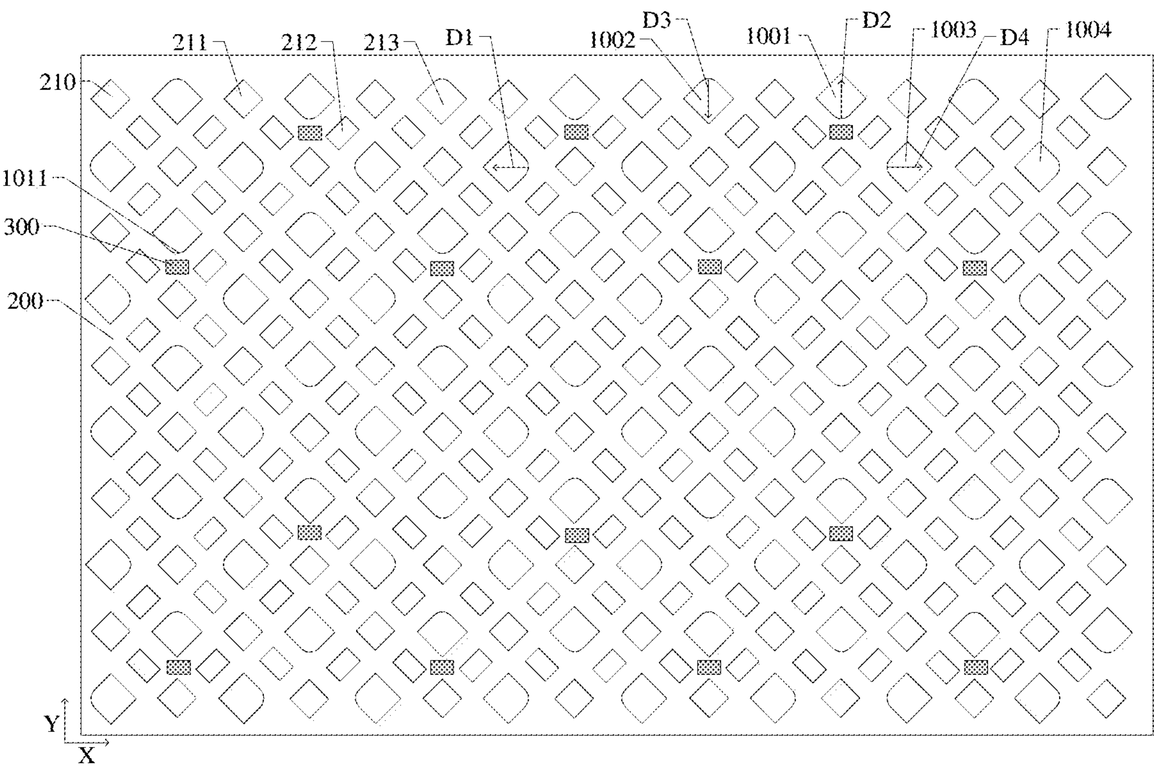
FIG. 10C is a schematic diagram of a planar structure of a pixel defining layer and a spacer provided according to another example of an embodiment of the present disclosure.

For example, FIG. 10C is a schematic plan view of a pixel defining layer and a spacer provided according to another example of an embodiment of the present disclosure. As shown in FIGS. 1 and 10C, four second color sub-pixels 120 are arranged between adjacent spacers 300 along one direction of the row direction and the column direction; and three first color sub-pixels 110 and three third color sub-pixels 130 are arranged between adjacent spacers 300 along the other direction of the row direction and the column direction. For example, four second openings 212 are arranged between adjacent spacers 300 along one direction of the row direction and the column direction; and three first openings 211 and three third openings 213 are arranged between adjacent spacers 300 along the other direction of the row direction and the column direction. It is schematically shown in the figures that part of the spacers 300 are located at the intervals corresponding to the first corner portions 1011, and part of the spacers 300 are not located at the intervals corresponding to the first corner portions 1011, and the embodiment of the present disclosure is not limited to this. For example, by adjusting the orientations of the first corner portions of the openings, all the spacers can be located at the intervals corresponding to the first corner portions. For example, the orientations of the first corner portions 1011 of all the third openings 213 can be adjusted to face downwards, so that all the spacers 300 can be located at the intervals corresponding to the first corner portions 1011. For example, the orientations of the first corner portions 1011 of all the first openings 211 can be adjusted to face upwards, so that all the spacers 300 are located at the intervals corresponding to the first corner portions 1011. For example, a first corner portion 1011 facing rightwards or leftwards can also be provided in the second opening 212, so that all the spacers 300 are located at the intervals corresponding to the first corner portions 1011.

For example, as shown in FIGS. 1 and 8A, the openings 210 that have the first corner portions 1011 and are configured to define light-emitting regions 101 of sub-pixels 100 of the same color include at least two types of openings; in different types of openings, the directions that the vertices of the first corner portions 1011 pointing to the vertices of the corner portions opposite to the first corner portions 1011 are different; the plurality of spacers 300 include a plurality of first spacer 310 and a plurality of second spacers 320, and the first spacers 310 and the second spacers 320 are distributed at the intervals corresponding to the first corner portions of different types of openings.

For example, as shown in FIGS. 1 and 8A, four second color sub-pixels 120 are arranged between adjacent first spacers 310 along one direction of the row direction and the column direction, and two first color sub-pixels 110 and two third color sub-pixels 130 are arranged between adjacent first spacers 310 along the other direction of the row direction and the column direction; four second color sub-pixels 120 are arranged between adjacent second spacers 320 along one direction of the row direction and the column direction, and two first color sub-pixels 110 and two third color sub-pixels 130 are arranged between adjacent second spacers 320 along the other direction of the row direction and the column direction. For example, four second openings 212 are arranged between adjacent first spacers 310 along one direction of the row direction and the column direction, and two first openings 211 and two third openings 213 are arranged between adjacent first spacers 310 along the other direction of the row direction and the column direction; four second openings 212 are arranged between adjacent second spacers 320 along one direction of the row direction and the column direction, and two first openings 211 and two third openings 213 are arranged between adjacent second spacers 320 along the other direction of the row direction and the column direction.

For example, as shown in FIGS. 1 and 2, at least part of the third openings 213 include the first corner portion 1011, and each of the spacers 300 is arranged at the interval between the first corner portion 1011 of the third opening 213 and the first opening 211 adjacent thereto.

For example, as shown in FIG. 5B, a distance between the spacer 300 and the first corner portion 1011 of the third opening 213 located at one side of the spacer 300 is a first distance S1, and the shortest distance between the spacer 300 and the corner portion of the first opening 211 located at the other side of the spacer 300 is a second distance S2, and the first distance S1 is not less than the second distance S2. The relationship between the first distance S1 and the second distance S2, and the magnitude relationships among the first distance S1, the second distance S2 and the distance S0 shown in FIG. 5C have been described as above and will not be repeated here.

For example, FIG. 5B only schematically shows the distance relationship between the spacer 300 and the opening 210 when the third opening 213 includes the first corner portion 1011 as compared with the distance relationship between the spacer 030 and the opening 021 when the first corner portion is not provided as shown in FIG. 5A, and the embodiment of the present disclosure is not limited to this. For example, as shown in FIG. 9, the corner portions opposite to each other of the first opening 211 and the third opening 213 are both first corner portions 1011, and the spacer 300 is located between these two first corner portions 1011. For example, at least part of the corner portions of the first opening and the third opening, excluding the corner portions opposite to each other, may also be configured as first corner portions. For example, at least one of the corner portions opposite to each other of two adjacent second openings arranged in the row direction or the column direction can be configured as the first corner portion 1011, and the spacer 300 is located between these two first corner portions.

In other examples except those shown in FIGS. 5B, 5C and 9, by arranging the first corner portion at at least one opening (which can be any one, any two or three of the first opening, the second opening and the third opening) and adjusting the distance between the spacer and the first corner portion of the opening, it can increase the distances between the spacer and the two openings located at two sides of the spacer, which is beneficial to reducing the probability for the spacer to fall off and improving the process yield.

For example, as shown in FIG. 9, two openings 210 adjacent to each other along at least one of the row direction or the column direction each include a first corner portion 1011, and the first corner portions 1011 of the two openings 210 are opposite to each other. The embodiment of the present disclosure schematically shows that the two openings can be a first opening 211 and a third opening 213, but it is not limited to this, and the two openings can also be two second openings 212.

For example, as shown in FIGS. 1 and 2, if the first corner portions 1011 of the openings 210 configured to define light-emitting regions 101 of sub-pixels 100 of the same color arranged in the row direction (or the column direction) have different orientations, a connecting line C1 of geometric centers of the light-emitting regions 101 of the sub-pixels 100 of the same color located in the same row (or the same column) is not a straight line, for example, it's a broken line.

For example, the opening 210 configured to define the light-emitting region 101 of the third color sub-pixel 130 includes the first corner portion 1011, and the opening 210 configured to define the light-emitting region 101 of the first color sub-pixel 110 does not include the first corner portion, then the connecting line of the geometric centers of the light-emitting regions of the plurality of first color sub-pixels 110 and the plurality of third color sub-pixels 130 located in the same row (or the same column) is not a straight line, for example, it's a broken line.

Figure 11A:
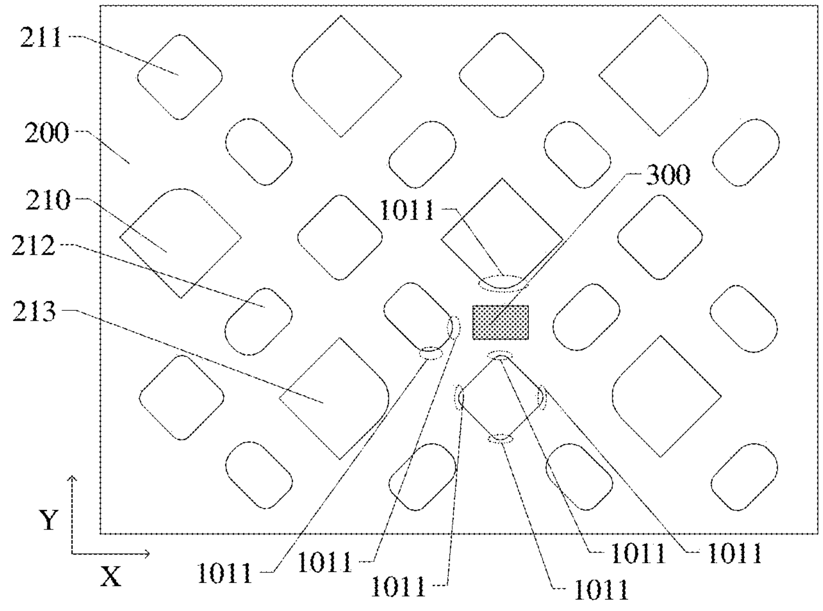
FIG. 11A is a schematic diagram of a planar structure of a pixel defining layer and a spacer provided according to another example of an embodiment of the present disclosure.

For example, FIG. 11A is a schematic plan view of a pixel defining layer and a spacer provided according to another example of an embodiment of the present disclosure. As shown in FIG. 11A, at least part of the openings 210 each include at least two first corner portions 1011. For example, the first opening 211 includes four first corner portions 1011, the second opening 212 includes two first corner portions 1011, and the third opening 213 includes one first corner portion 1011. The embodiment of the present disclosure is not limited to this, and the first opening may also include at least two first corner portions.

For example, as shown in FIG. 11A, the four openings 210 surrounding the spacer 300 each include the first corner portion 1011, and the corner portion closest to the spacer 300 in each opening 210 is the first corner portion 1011, so that the size of the spacer can be increased in both directions, and/or the distance between the spacer and the opening can be increased in both directions, which is beneficial to reducing the probability for the spacer to fall off, and improving the process yield of products and the supporting function of the spacer.

For example, as shown in FIG. 11A, the first opening 211, the second opening 212 and the third opening 213 each include the first corner portion 1011; and at least two types of openings 210 among the first opening 211, the second opening 212 and the third opening 213 include different numbers of first corner portions 1011.

For example, at least part of the openings 210 each include four corner portions; the four corner portions of one of the first opening 211, the second opening 212 and the third opening 210 include two, three or four first corner portions 1011, and the four corner portions of at least one of the other two openings 210 of the first opening 211, the second opening 212 and the third opening 213 include one first corner portion 1011.

For example, when the number of the corner portions of each of the openings is four, the embodiment of the present disclosure does not limit the number of the first corner portions included in the openings configured to define light-emitting regions of sub-pixels of different colors, and the numbers of the first corner portions included in different openings that can be configured to define the light-emitting regions of sub-pixels of three colors are different from each other and can be selected from 1 to 4. It is also possible that, two types of openings configured to define light-emitting regions of sub-pixels of two colors include the same number of first corner portions, and the third type of openings include different number of first corner portions, so the number of the first corner portions included in the two types of openings can be one value selected from 1 to 4 and the number of the first corner portions included in the third type of openings can be another value selected from 1 to 4. It is also possible that, only two openings configured to define light-emitting regions of sub-pixels of two colors include the first corner portions, and the numbers of the first corner portions included in the two different openings can be two values selected from 1 to 4, which can be set in the embodiment of the present disclosure according to the requirements of products.

Of course, the embodiment of the present disclosure is not limited to the case where each opening includes four first corner portions, but also includes the cases of three or more than four first corner portions. At this time, the number of first corner portions in the opening can be set according to the above rules.

It should be noted that, the embodiment of the present disclosure schematically shows the corner portions included in the opening of the pixel defining layer except the first corner portion 1011 are all right angles or acute angles formed by two straight sides intersecting with each other, but it is not limited to this, and at least part of the other corner portions except the first corner portion 1011 can also be rounded angles (second corner portions) which can be formed by cutting off a vertex angel between two sides of a polygon from the polygon, wherein the ratio of the length of the portion of at least one of the two sides that is cut off to the length of the side is 0.05 to 0.2. The definition of the second corner portion here can be the same as that of the first corner portion 1011, but the curvature (or the arc radian or the arc length) of the second corner portion is smaller than that of the first corner portion 1011.

Figure 11B:
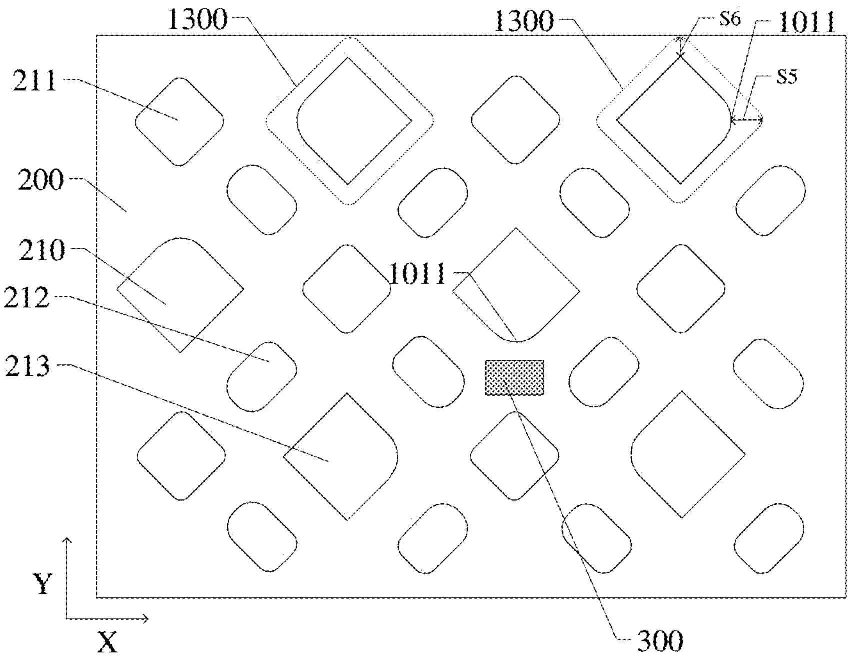
FIG. 11B is a schematic diagram of a correspondence between light-emitting layers of part of sub-pixels and corresponding openings.

FIG. 11B is a schematic diagram of a correspondence between light-emitting layers of part of the sub-pixels and the corresponding openings. As shown in FIG. 11B, the light-emitting layers 1300 of sub-pixels of the same color have the same shape and the same size. The figure schematically shows the light-emitting layers of the third color sub-pixels have the same shape and the same size. For example, sub-pixels of other colors, such as the light-emitting layers of the first color sub-pixels, have the same shape and the same size.

For example, as shown in FIG. 11B, the light-emitting layer 1300 includes a part located in the opening 210 and another part located on the pixel defining layer 2000. The part of the light-emitting layer 1300 on the pixel defining layer 200 has a boundary, and a distance S5 between the boundary and the first corner portion 1011 corresponding to the light-emitting layer 1300 is different from distances S6 between the boundary and other corner portions corresponding to the light-emitting layer 1300.

For example, the distance S5 between the boundary of the light-emitting layer 1300 and the first corner portion of the opening 210 corresponding to the light-emitting layer 1300 is greater than the distances S6 between the boundary and other corner portions corresponding to the light-emitting layer 1300. For example, the distances S6 between the boundary and other corner portions corresponding to the light-emitting layer 1300 may be equal to each other. For example, the ratio of the distance S5 to the distance S6 may range from 1.1 to 10. For example, the ratio of the distance S5 to the distance S6 may range from 1.2 to 7. For example, the ratio of the distance S5 to the distance S6 may range from 1.3 to 5. For example, the ratio of the distance S5 to the distance S6 may range from 1.4 to 3. For example, the ratio of the distance S5 to the distance S6 may range from 1.5 to 2. For example, the ratio of the distance S5 to the distance S6 may range from 1.6 to 1.8.

For example, as shown in FIG. 11B, the first corner portions 1011 of the openings 210 configured to define light-emitting regions of sub-pixels of the same color have different orientations, but the light-emitting layers 1300 formed in the openings 210 defining light-emitting regions of sub-pixels of the same color may have basically the same shape and size.

Figure 12:
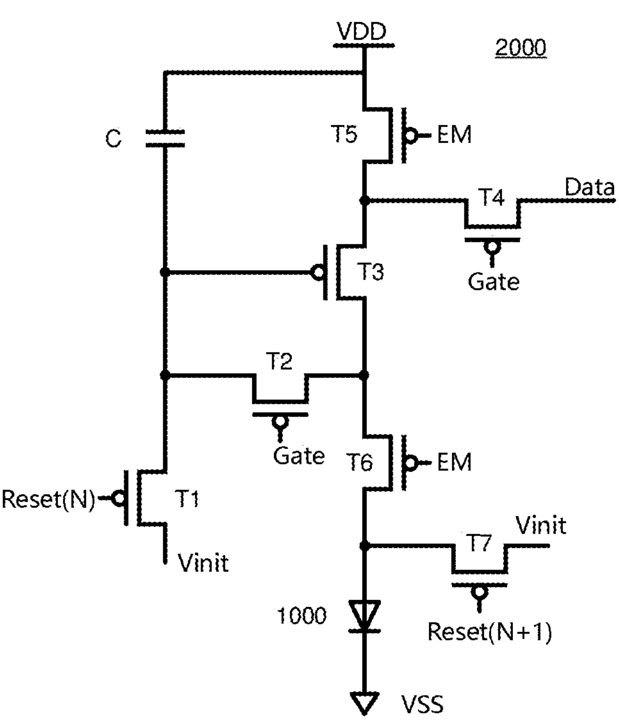
FIG. 12 is an equivalent diagram of a pixel circuit.

For example, each of the sub-pixels further includes a pixel circuit configured to be connected with the light-emitting element to drive the light-emitting element to emit light. For example, FIG. 12 is an equivalent diagram of a pixel circuit. As shown in FIG. 12, the pixel circuit 2000 includes a second reset transistor T1, a second light emission control transistor T5, a first light emission control transistor T6, a data writing transistor T4, a driving transistor T3, a threshold compensation transistor T2, a first reset control transistor T7 and a storage capacitor C. For example, the display substrate further includes a reset power signal line, a scanning signal line, a power signal line, a reset control signal line, a light emission control signal line and a data line.

For example, a first electrode of the threshold compensation transistor T2 is connected to a first electrode of the driving transistor T3, and a second electrode of the threshold compensation transistor T2 is connected to a gate electrode of the driving transistor T3; a first electrode of the first reset control transistor T7 is connected to the reset power signal line to receive a reset signal Vinit, and a second electrode of the first reset control transistor T7 is connected to a second electrode of the light-emitting element 1000; a first electrode of the data writing transistor T4 is connected to a second electrode of the driving transistor T3, a second electrode of the data writing transistor T4 is connected to the data line to receive a data signal Data, and a gate electrode of the data writing transistor T4 is electrically connected to the scanning signal line to receive a scanning signal Gate; a first electrode of the storage capacitor C is electrically connected to the power signal line, and a second electrode of the storage capacitor C is electrically connected to the gate electrode of the driving transistor T3; a gate electrode of the threshold compensation transistor T2 is electrically connected to the scanning signal line to receive a compensation control signal; a gate electrode of the first reset transistor T7 is electrically connected to the reset control signal line to receive a reset control signal Reset (N+1); a first electrode of the second reset transistor T1 is electrically connected to the reset power signal line to receive a reset signal Vinit, a second electrode of the second reset transistor T1 is electrically connected to the gate electrode of the driving transistor T3, and a gate electrode of the second reset transistor T1 is electrically connected to the reset control signal line to receive a reset control signal Reset (N); a gate electrode of the first light emission control transistor T6 is electrically connected to the light emission control signal line to receive a light emission control signal EM; a first electrode of the second light emission control transistor T5 is electrically connected to the power signal line to receive a first power signal VDD, a second electrode of the second light emission control transistor T5 is electrically connected to the second electrode of the driving transistor T3, a gate electrode of the second light emission control transistor T5 is electrically connected to the light emission control signal line to receive the light emission control signal EM, and a first electrode of the light-emitting element 1000 is connected to a voltage terminal VSS. The power signal line mentioned above refers to a signal line that outputs a voltage signal VDD, and can be connected to a voltage source to output a constant voltage signal, such as a positive voltage signal.

It should be noted that, in addition to the 7TiC (i.e., seven transistors and one capacitor) structure shown in FIG. 12, the pixel circuit in the embodiment of the present disclosure may also have other structures including other numbers of transistors, such as a 7T2C structure, a 6TiC structure, a 6T2C structure or a 9T2C structure, which is not limited in the embodiment of the present disclosure.

Figure 13:
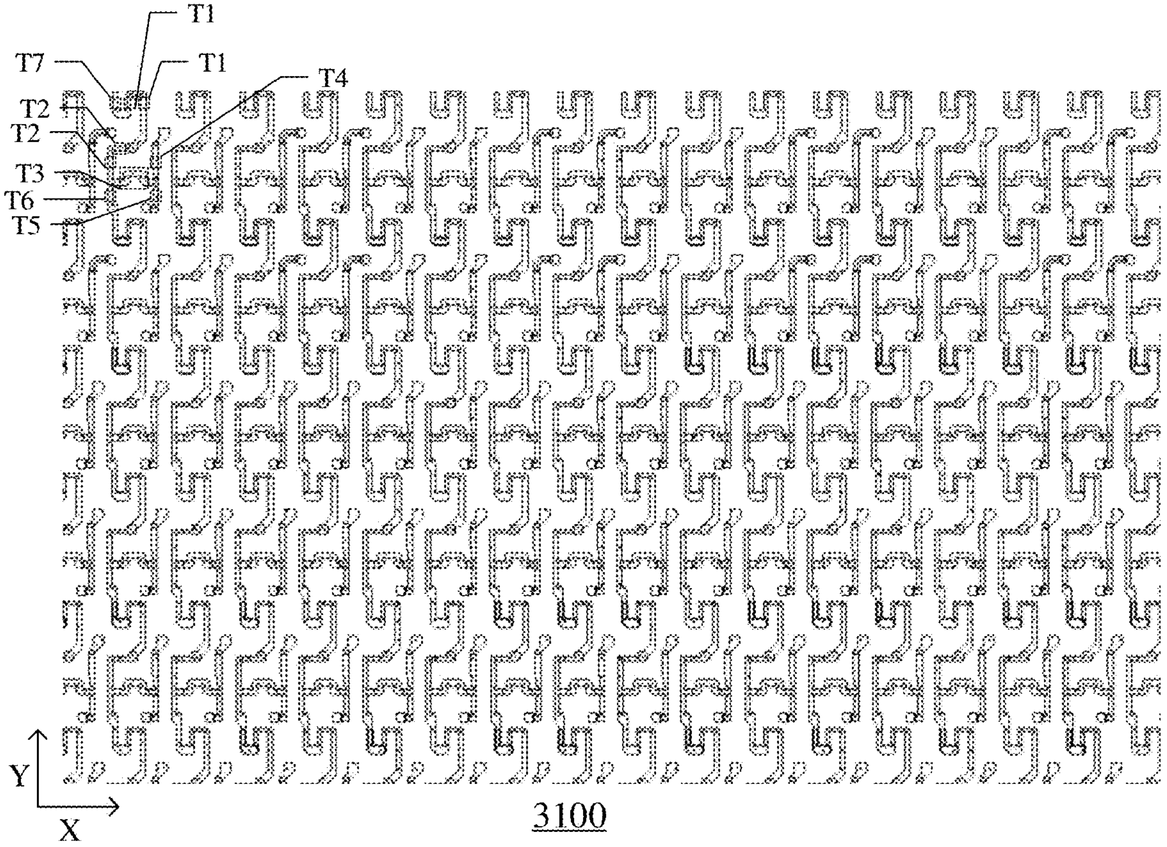
FIG. 13 is a schematic diagram of a partial planar structure of an active semiconductor layer.
Figure 14:
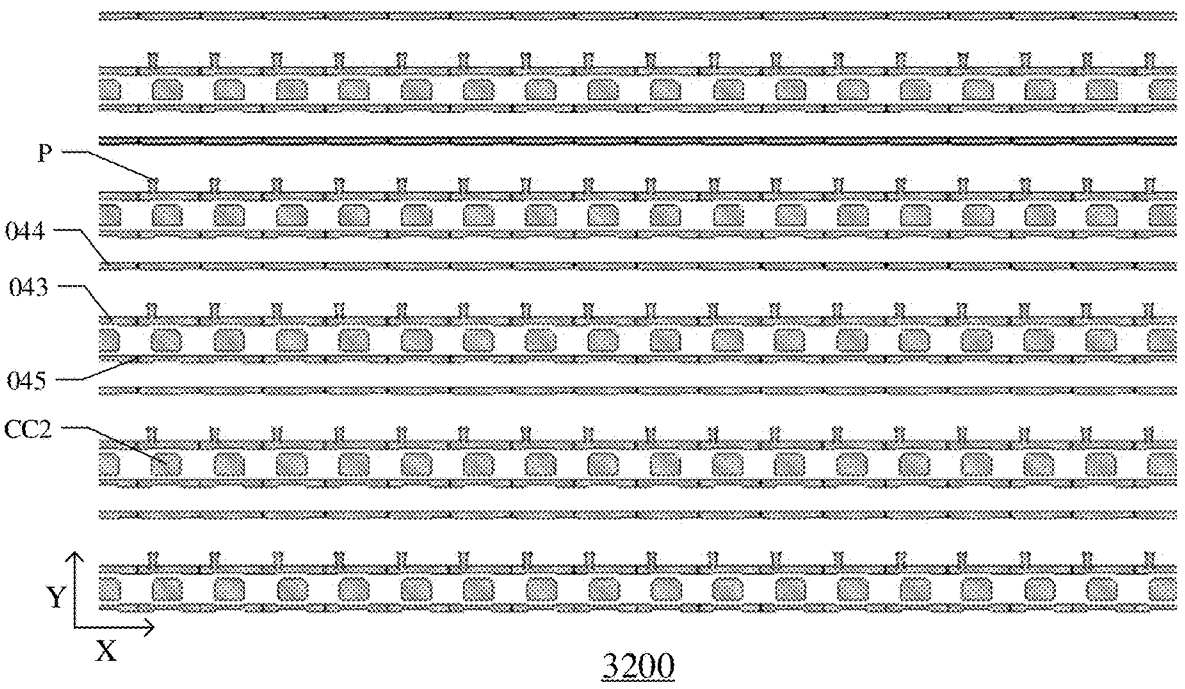
FIG. 14 is a schematic diagram of a partial planar structure of a first conductive layer.
Figure 15:
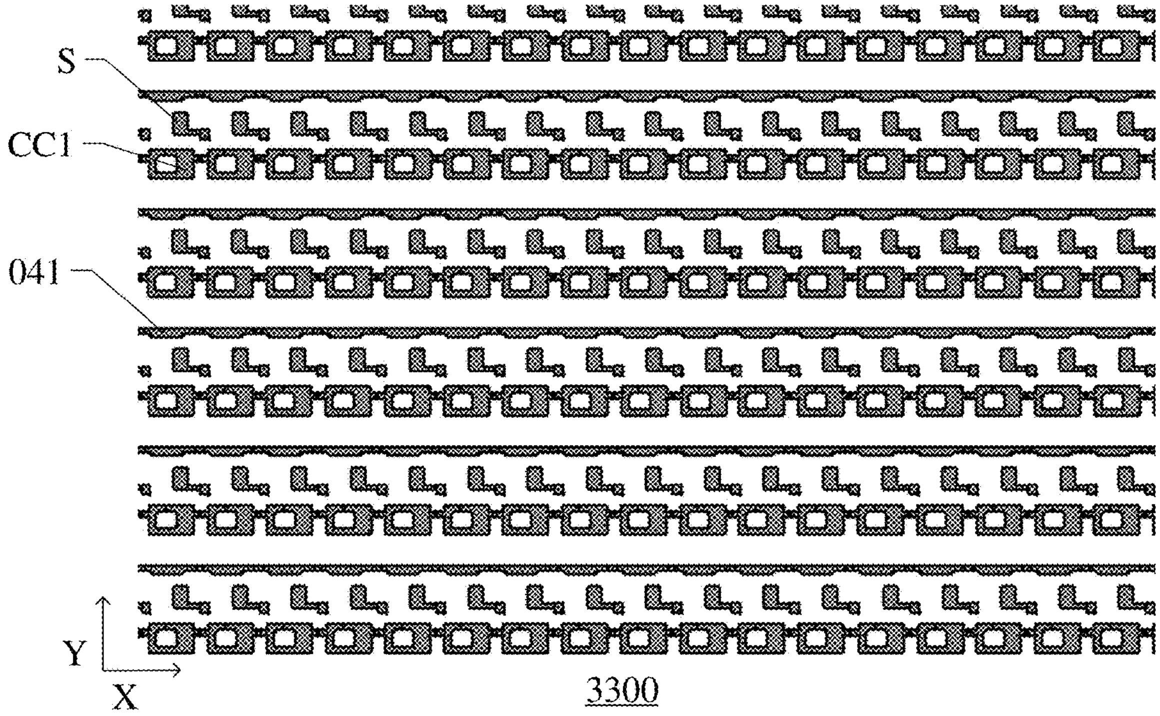
FIG. 15 is a schematic diagram of a partial planar structure of a second conductive layer.
Figure 16:
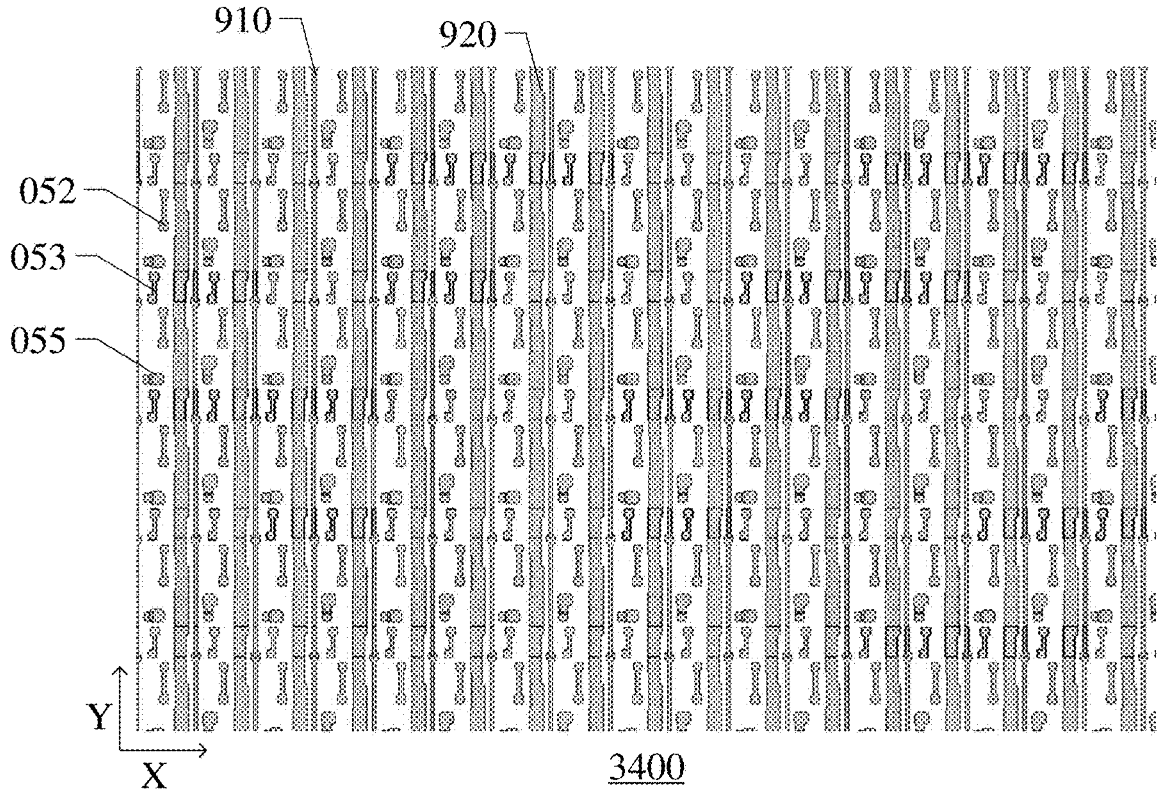
FIG. 16 is a schematic diagram of a partial planar structure of a source-drain metal layer.
Figure 17:
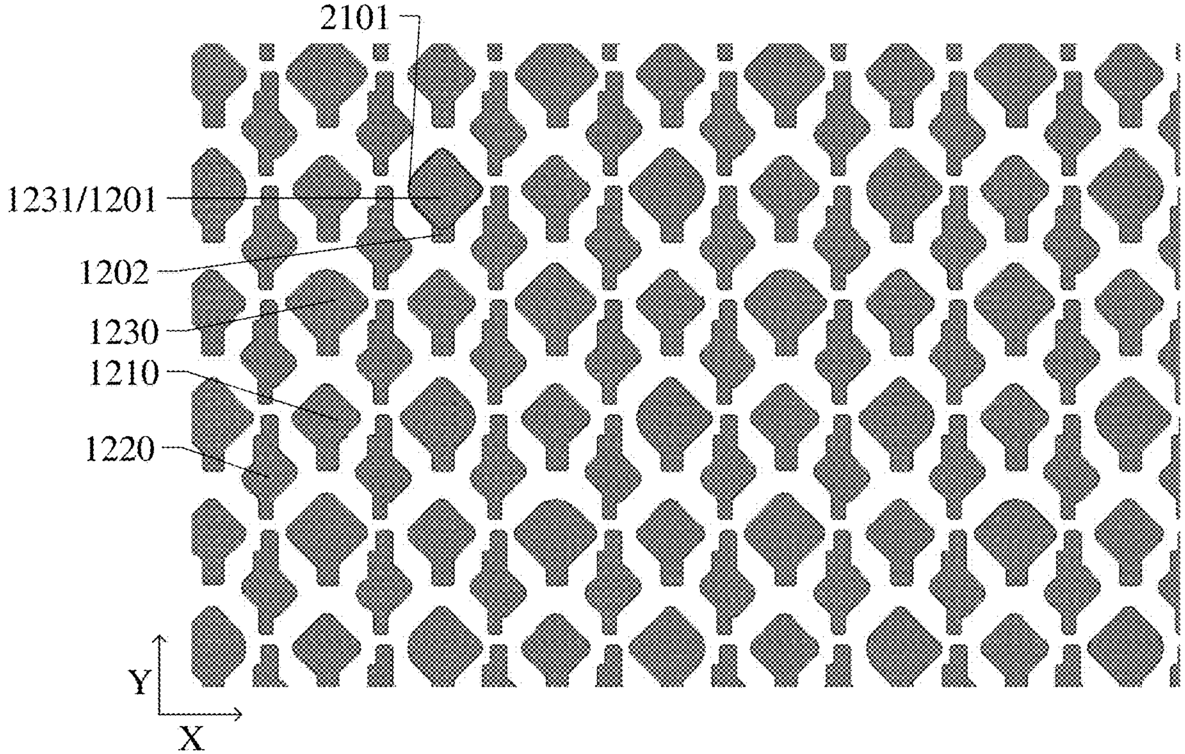
FIG. 17 is a schematic diagram of a planar structure of second electrodes of part of sub-pixels.
Figure 18:
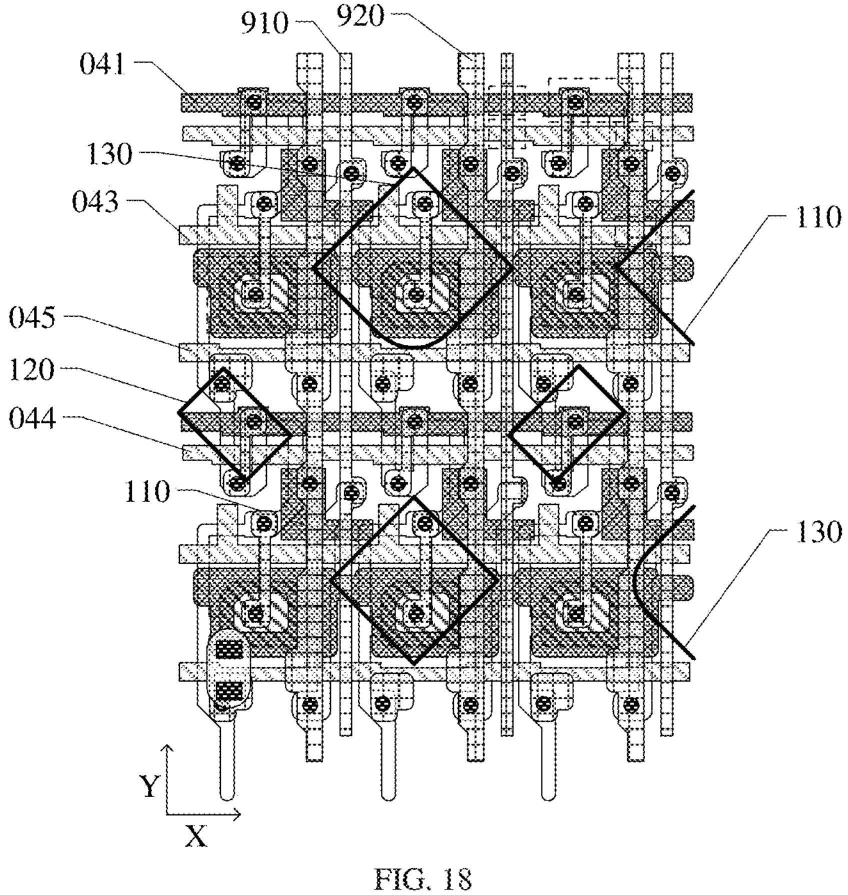
FIG. 18 is a schematic diagram of an overlap of light-emitting regions of part of sub-pixels with an active semiconductor layer, a first conductive layer, a second conductive layer and a source-drain metal layer.

For example, FIG. 13 is a schematic diagram of a partial planar structure of an active semiconductor layer, FIG. 14 is a schematic diagram of a partial planar structure of a first conductive layer, FIG. 15 is a schematic diagram of a partial planar structure of a second conductive layer, FIG. 16 is a schematic diagram of a partial planar structure of a source-drain metal layer, FIG. 17 is a schematic diagram of a planar structure of a second electrode of part of sub-pixels, and FIG. 18 is a schematic diagram of an overlap of light-emitting regions of part of sub-pixels with an active semiconductor layer, a first conductive layer, a second conductive layer and a source-drain metal layer.

For example, as shown in FIG. 13, the active semiconductor layer 3100 may be formed from a semiconductor material by a patterning process. The active semiconductor layer 3100 can be used to form active layers of the above-mentioned second reset transistor T1, threshold compensation transistor T2, driving transistor T3, data writing transistor T4, second light emission control transistor T5, first light emission control transistor T6 and first reset control transistor T7. The active semiconductor layer 3100 includes an active layer pattern (channel region) and a doped region pattern (source-drain doped region) of each transistor of each sub-pixel, and the active layer pattern and the doped region pattern of each transistor in the same pixel circuit are integrally arranged.

It should be noted that, the active layer may include an integrally formed low-temperature polysilicon layer, and the source region and the drain region may be converted into conductors by doping, for example, to realize electrical connections of respective structures. That is, the active semiconductor layer of each transistor of each sub-pixel is an integral pattern formed by p-silicon, and each transistor in the same pixel circuit includes a doped region pattern (i.e., source region and drain region) and an active layer pattern, and the active layers of different transistors are separated by doped structures.

For example, the active semiconductor layer 3100 can be made of amorphous silicon, polycrystalline silicon, oxide semiconductor materials, and the like. It should be noted that the source region and the drain region as mentioned above may be regions doped with n-type impurity or p-type impurity.

The rectangular dashed boxes in FIG. 13 show various portions where the first conductive layer 3200 overlap with the active semiconductor layer 3100, which portions are used as channel regions (i.e., the above-mentioned active layer pattern) of respective transistors. Portions of the active semiconductor layer at both sides of each channel region are converted into conductors by processes such as ion doping, so as to serve as the first electrode and the second electrode (i.e. the above-mentioned doped region pattern) of each transistor. The source electrode and drain electrode of the transistor may be symmetrical in their structures, so there may be no difference in physical structures between the source electrode and drain electrode. In the embodiment of the present disclosure, except the gate electrode serving as a control electrode, one of the remaining electrodes of a transistor is directly described as the first electrode and the other one is directly described as the second electrode, in order to distinguish the transistor. Therefore, the first electrode and the second electrode of all or part of the transistors in the embodiment of the present disclosure can be interchanged as required.

For example, the display substrate includes a gate insulating layer located at the side of the active semiconductor layer away from the base substrate, for insulating the active semiconductor layer 3100 from a first conductive layer 3200 (i.e., a gate metal layer) formed subsequently. FIG. 14 shows the first conductive layer 3200 included in the display substrate, and the first conductive layer 3200 is arranged on the gate insulating layer so as to be insulated from the active semiconductor layer 3100. The first conductive layer 3200 may include a second electrode CC2 of a capacitor C, a plurality of scanning signal lines 043, a plurality of reset control signal lines 044, a plurality of light emission control signal lines 045, and a gate electrode of the second reset transistor T1, a gate electrode of the threshold compensation transistor T2, a gate electrode of the driving transistor T3, a gate electrode of the data writing transistor T4, a gate electrode of the second light emission control transistor T5, a gate electrode of the first light emission control transistor T6 and a gate electrode of the first reset control transistor T7.

For example, as shown in FIGS. 13 and 14, the gate electrode of the data writing transistor T3 may be a portion where the scanning signal line 043 overlaps with the active semiconductor layer 3100; the gate electrode of the first light emission control transistor T6 may be a first portion where the light emission control signal line 045 overlaps with the active semiconductor layer 3100, and the gate electrode of the second light emission control transistor T5 may be a second portion where the light emission control signal line 045 overlaps with the active semiconductor layer 3100. The gate electrode of the second reset transistor T1 is a first portion where the reset control signal line 044 overlaps with the active semiconductor layer 3100, and the gate electrode of the first reset control transistor T7 is a second portion where the reset control signal line 044 overlaps with the active semiconductor layer 3100. The threshold compensation transistor T2 may be a thin film transistor with a dual-gate structure, a first gate electrode of the threshold compensation transistor T2 may be a portion where the scanning signal line 043 overlaps with the active semiconductor layer 3100, and a second gate electrode of the threshold compensation transistor T2 may be a portion where a protruded structure P protruding from the scanning signal line 043 overlaps with the active semiconductor layer 3100. As shown in FIG. 14, the gate electrode of the driving transistor T1 may be the second electrode CC2 of the capacitor C.

For example, a first insulating layer is formed on the first conductive layer 3200 to insulate the first conductive layer 3200 from a second conductive layer 3300 formed subsequently.

For example, as shown in FIGS. 13 to 15, the second conductive layer 3300 includes the first electrode CC1 of the capacitor C and a plurality of reset power signal lines 041 extending in the X direction. The first electrode CC1 of the capacitor C and the second electrode CC2 of the capacitor C at least partially overlap to form the capacitor C.

For example, as shown in FIG. 15, the display substrate further includes a plurality of covering portions S. Each threshold compensation transistor T2 includes two gate electrodes and an active semiconductor layer 3100 located between the two gate electrodes. In the direction perpendicular to the base substrate, the covering portions S overlap with the active semiconductor layer 3100, a data line 910 (described later) and a power signal line 920 (described later) between the two gate electrodes.

For example, a second insulating layer is formed on the second conductive layer 3300 to insulate the second conductive layer 3300 from a source-drain metal layer 3400 formed subsequently.

For example, as shown in FIG. 16, the source-drain metal layer 3400 includes a data line 910 and a power signal line 920 which are extending in the Y direction. The data line 910 is electrically connected to the second electrode of the data writing transistor T2 through a via hole penetrating the gate insulating layer, the first insulating layer and the second insulating layer. The power signal line 920 is electrically connected to the first electrode of the second light emission control transistor T5 through a via hole penetrating the gate insulating layer, the first insulating layer and the second insulating layer. The power signal line 920 and the data line 910 are alternately arranged in the X direction. The power signal line 920 is electrically connected to the first electrode CC1 of the capacitor C through a via hole penetrating the second insulating layer.

For example, a passivation layer and a planarization layer may be provided at the side of the source-drain metal layer 3400 away from the base substrate to protect the source-drain metal layer 3400.

For example, as shown in FIG. 16, each pixel circuit further includes a connection part 052 and a connection part 053, which are arranged in the same layer as the data line 910. The connection part 052 is configured to connect the second electrode of the threshold compensation transistor T2 and the gate electrode of the driving transistor T3; and the connection part 053 is configured to connect the first electrode of the first reset control transistor T7 and the reset power signal line 041. For example, one end of the connection part 052 is electrically connected to the second electrode of the threshold compensation transistor T2 through a via hole penetrating the gate insulating layer, the first insulating layer and the second insulating layer, and the other end of the connection part 052 is electrically connected to the gate electrode of the driving transistor T3 (that is, the second electrode CC2 of the capacitor C) through a via hole penetrating the first insulating layer and the second insulating layer. One end of the connection part 053 is electrically connected to the reset power signal line 041 through a via hole penetrating the second insulating layer, and the other end of the third connection part 053 is electrically connected to the first electrode of the first reset control transistor T7 through a via hole penetrating the gate insulating layer, the first insulating layer and the second insulating layer.

For example, as shown in FIG. 16, each pixel circuit further includes a connection part 055 arranged in the same layer as the data line 910, and the connection part 055 is used for connecting the second electrode of the light-emitting element with the second electrode of the first reset control transistor T7.

For example, as shown in FIGS. 2-3 and 17, the second electrode 1200 of each sub-pixel 100 includes a main electrode 1201, and the shape of the main electrode 1201 of at least part of the second electrodes 1200 may be the same as the shape of the light-emitting region 101 of the sub-pixel or the shape of the opening 210 corresponding to the sub-pixel. For example, if the shape of the light-emitting region 101 of the first color sub-pixel 110 is rectangle, the shape of the main electrode of the second electrode 1210 of the first color sub-pixel 110 may be rectangle.

For example, the geometric center of the main electrode 1201 may approximately coincide with the geometric center of the light-emitting region 101 corresponding to the main electrode, or there is small distance between the two geometric centers.

For example, the orthographic projection of the opening 210 of the pixel defining layer 200 on the base substrate 10 is located within the orthographic projection of the main electrode 1201 of the second electrode 1200 of the corresponding light-emitting element 1000 on the base substrate 10.

For example, for at least part of the openings 210 having the first corner portion 1011, the main electrode 1201 of the corresponding sub-pixel 100 in the opening 210 has substantially the same shape as the opening 210. For example, the third opening 213 configured to define the light-emitting region 101 of the third color sub-pixel 130 includes a first corner portion 1011, and the main electrode 1201 of the second electrode 1230 of the third color sub-pixel 130 also includes a corner portion 2101 having a shape corresponding to the shape of the first corner portion 1011. According to the embodiment of the present disclosure, the main electrode of a corresponding sub-pixel in an opening having the first corner portion is configured to have approximately the same shape as the opening, so that the transmittance of the display area where the second electrode is located can be improved under the premise of ensuring the display effect, which is beneficial to integrating applications such as off-screen fingerprint identification or off-screen camera technology.

For example, as shown in FIG. 17, each second electrode 1200 further includes a connection electrode 1202. For example, the connection electrode 1202 may be integrated with the main electrode 1201, for example, the connection electrode 1202 is configured to be connected to a transistor of the pixel circuit through a via hole.

FIG. 18 shows positional relationships between the light-emitting regions of part of the sub-pixels (e.g., the light-emitting regions of the first color sub-pixel 110, the second color sub-pixel 120 and the third color sub-pixel 130) and the active semiconductor layer, the first conductive layer, the second conductive layer and the source-drain metal layer.

For example, the embodiment of the present disclosure is not limited to the case where the second color sub-pixel has a rectangular shape, it may also have an ellipse shape, an olive shape (for example, a shape with a larger width at middle and smaller widths at both ends) and the like.

Another embodiment of the present disclosure provides a display apparatus including the display substrate described above.

In the display apparatus provided by the embodiment of the present disclosure, the spacers are arranged at the intervals of the openings of the pixel defining layer corresponding to the first corner portions, which is beneficial to improving the process yield or improving the supporting function of the spacers.

For example, the display apparatus provided by the embodiment of the present disclosure may be a light-emitting diode display apparatus.

For example, the display apparatus may further include a cover plate located at the display side of the display substrate.

For example, the display apparatus can be a television set, a digital camera, a mobile phone, a watch, a tablet computer, a notebook computer, a navigator and other products or components with display functions, and the embodiment of the present disclosure is not limited to this.

For example, the display apparatus can be a display apparatus with an off-screen camera. The display apparatus includes functional components, for example, at least one selected from the group consisted of a camera module (for example, a front camera module), a 3D structured light module (for example, a 3D structured light sensor), a time-of-flight method based 3D imaging module (for example, a time-of-flight method based sensor), an infrared sensing module (for example, an infrared sensing sensor), and the like.

The following statements should be noted: (1) The accompanying drawings related to the embodiment(s) of the present disclosure involve only the structure(s) in connection with the embodiment(s) of the present disclosure, and other structure(s) can be referred to common design(s); (2) In case of no conflict, features in one embodiment or in different embodiments of the present disclosure can be combined.

The foregoing is merely exemplary embodiments of the invention, but is not used to limit the protection scope of the invention. The protection scope of the invention shall be defined by the attached claims.

The invention claimed is:

1. A display substrate, comprising:

a base substrate;

a plurality of sub-pixels located on the base substrate and arranged in an array along a row direction and a column direction to form a plurality of pixel rows and a plurality of pixel columns, the plurality of sub-pixels comprising a plurality of light-emitting regions;

a pixel defining layer located on the base substrate, the pixel defining layer comprising a plurality of openings to define the plurality of light-emitting regions; and a plurality of spacers located at a side of the pixel defining layer away from the base substrate and distributed at an interval between adjacent openings, wherein, a shape of at least one of the plurality of openings is a polygon with at least one vertex angle cut off, and a corner portion of the opening comprises a first corner portion formed by cutting off one vertex angle included between two sides of the polygon from the polygon, at least one of the plurality of spacers is arranged at an interval between the first corner portion and the opening adjacent to the first corner portion, and a connecting line between a geometric center of the opening where the first corner portion is located and a geometric center of the opening adjacent to the first corner portion passes through the first corner portion and the spacer, an area of a region in which the first corner portion and the vertex angle corresponding thereto of the polygon are not overlapped is larger than an area of a region in which at least one other corner portion of the opening and the vertex angle corresponding thereto of the polygon are not overlapped, the openings that have the first corner portion comprise different types of openings, in the different types of openings, vertices of the first corner portions point to vertices of the corner portions opposite to the first corner portions in different directions, at least two types of openings are provided in at least one pixel row, and at least two types of openings are provided in at least one pixel column, and the plurality of sub-pixels comprises sub-pixels of different colors, and the plurality of spacers are distributed at an interval between adjacent openings corresponding to sub-pixels of different colors.

2. The display substrate according to claim 1, wherein a ratio of a length of a portion of at least one of the two sides that is cut off to an original length of the side before being cut off is 0.2-0.8.

3. The display substrate according to claim 1, wherein each of the plurality of spacers is arranged at an interval between the first corner portion and the opening adjacent to the first corner portion.

4. The display substrate according to claim 1, wherein a number of the openings having the first corner portion is not less than a number of the plurality of spacers.

5. The display substrate according to claim 1, wherein the openings having the first corner portion are configured to define the light-emitting regions of the sub-pixels of at least one color.

6. The display substrate according to claim 5, wherein the openings having the first corner portion comprise a same type of openings.

7. The display substrate according to claim 5, wherein the openings that have the first corner portion and are configured to define the light-emitting regions of the sub-pixels of a same color comprise at least two types of openings, and at least part of the plurality of spacers are distributed at intervals corresponding to a same type of openings.

8. The display substrate according to claim 7, wherein the plurality of spacers comprise a plurality of first spacers, the plurality of first spacers are distributed at the intervals corresponding to the first corner portions of the same type of openings, and are uniformly distributed.

9. The display substrate according to claim 8, wherein the at least two types of openings comprise a first type of openings and a second type of openings, and the plurality of first spacers are distributed at the intervals corresponding to the first corner portions of at least part of the first type of openings, the plurality of spacers further comprise a plurality of second spacers, the plurality of second spacers are distributed at the intervals corresponding to the first corner portions of at least part of the second type of openings and are uniformly distributed, wherein the at least two types of openings further comprise a third type of openings and a fourth type of openings, and in two types of openings among the first type of openings, the second type of openings, the third type of openings and the fourth type of openings, directions in which vertices of first corner portions point to vertices of corner portions opposite to the first corner portions are opposite to each other, and in the other two types of openings among the first type of openings, the second type of openings, the third type of openings and the fourth type of openings, directions in which vertices of first corner portions point to vertices of corner portions opposite to the first corner portions are opposite to each other.

10. The display substrate according to claim 5, wherein at least a portion of the plurality of spacers is disposed between the first corner portions of the openings of the sub-pixels of a first color and openings adjacent thereto, and at least another portion of the plurality of spacers is disposed between the first corner portions of the openings of the sub-pixels of a second color and openings adjacent thereto.

11. The display substrate according to claim 5, wherein each of at least two openings closely adjacent to at least one spacer comprises the first corner portion, and the first corner portion of each of the at least two openings is the corner portion of the opening closest to the spacer, wherein each of the plurality of sub-pixels comprises a light-emitting element, the light-emitting element comprises a first electrode, a light-emitting layer and a second electrode which are arranged in a stacked manner, wherein the second electrode is located at a side of the light-emitting layer facing the base substrate, and the second electrode comprises a main electrode, and a shape of the main electrode of the sub-pixels corresponding to at least part of the openings having the first corner portion is approximately the same as a shape of the opening.

12. The display substrate according to claim 11, wherein light-emitting layers of the sub-pixels of a same color have a same shape and a same size, and a distance between a boundary of the light-emitting layer on the pixel defining layer and the first corner portion corresponding to the light-emitting layer is different from distances between the boundary of the light-emitting layer on the pixel defining layer and other corner portions corresponding to the light-emitting layer.

13. The display substrate according to claim 1, wherein the plurality of sub-pixels comprise a plurality of first color sub-pixels, a plurality of second color sub-pixels and a plurality of third color sub-pixels, the plurality of first color sub-pixels and the plurality of third color sub-pixels are alternately arranged along both the row direction and the column direction to form a plurality of first pixel rows and a plurality of first pixel columns, the plurality of second color sub-pixels are arranged in an array along both the row direction and the column direction to form a plurality of second pixel rows and a plurality of second pixel columns, the plurality of first pixel rows and the plurality of second pixel rows are alternately arranged along the column direction and staggered from each other in the row direction, and the plurality of first pixel columns and the plurality of second pixel columns are alternately arranged along the row direction and staggered from each other in the column direction, the plurality of openings comprise a plurality of first openings, a plurality of second openings and a plurality of third openings, wherein the plurality of first openings are configured to define the light-emitting regions of the plurality of first color sub-pixels, the plurality of second openings are configured to define the light-emitting regions of the plurality of second color sub-pixels, and the plurality of third openings are configured to define the light-emitting regions of the plurality of third color sub-pixels, at least one of the first opening, the second opening or the third opening comprises the first corner portion, at least part of the plurality of spacers are distributed at the intervals between two adjacent openings arranged along at least one of the column direction or the row direction.

14. A display substrate, comprising:

a base substrate;

a plurality of sub-pixels located on the base substrate, the plurality of sub-pixels comprising a plurality of light-emitting regions;

a pixel defining layer located on the base substrate, the pixel defining layer comprising a plurality of openings to define the plurality of light-emitting regions; and a plurality of spacers located at a side of the pixel defining layer away from the base substrate and distributed at an interval between adjacent openings, wherein, a shape of at least one of the plurality of openings is a polygon with at least one vertex angle cut off, and a corner portion of the opening comprises a first corner portion formed by cutting off one vertex angle included between two sides of the polygon from the polygon;

at least one of the plurality of spacers is arranged at an interval between the first corner portion and the opening adjacent to the first corner portion, and a connecting line between a geometric center of the opening where the first corner portion is located and a geometric center of the opening adjacent to the first corner portion passes through the first corner portion and the spacer, wherein the plurality of sub-pixels comprise a plurality of first color sub-pixels, a plurality of second color sub-pixels and a plurality of third color sub-pixels, the plurality of first color sub-pixels and the plurality of third color sub-pixels are alternately arranged along both a row direction and a column direction to form a plurality of first pixel rows and a plurality of first pixel columns, the plurality of second color sub-pixels are arranged in an array along both the row direction and the column direction to form a plurality of second pixel rows and a plurality of second pixel columns, the plurality of first pixel rows and the plurality of second pixel rows are alternately arranged along the column direction and staggered from each other in the row direction, and the plurality of first pixel columns and the plurality of second pixel columns are alternately arranged along the row direction and staggered from each other in the column direction;

the plurality of openings comprise a plurality of first openings, a plurality of second openings and a plurality of third openings, wherein the plurality of first openings are configured to define the light-emitting regions of the plurality of first color sub-pixels, the plurality of second openings are configured to define the light-emitting regions of the plurality of second color sub-pixels, and the plurality of third openings are configured to define the light-emitting regions of the plurality of third color sub-pixels;

at least one of the first opening, the second opening or the third opening comprises the first corner portion, at least part of the plurality of spacers are distributed at the intervals between two adjacent openings arranged along at least one of the column direction or the row direction, wherein four second color sub-pixels are arranged between adjacent spacers along one of the row direction and the column direction, and two first color sub-pixels and two third color sub-pixels are arranged between adjacent spacers along the other of the row direction and the column direction; or, six second color sub-pixels are arranged between adjacent spacers along one of the row direction and the column direction, and three first color sub-pixels and three third color sub-pixels are arranged between adjacent spacers along the other of the row direction and the column direction; or, four second color sub-pixels are arranged between adjacent spacers along one of the row direction and the column direction, and three first color sub-pixels and three third color sub-pixels are arranged between adjacent spacers along the other of the row direction and the column direction; or, six second color sub-pixels are arranged between adjacent spacers along one of the row direction and the column direction, and two first color sub-pixels and two third color sub-pixels are arranged between adjacent spacers along the other of the row direction and the column direction.

15. A display substrate, comprising:

a base substrate;

a plurality of sub-pixels located on the base substrate, the plurality of sub-pixels comprising a plurality of light-emitting regions;

a pixel defining layer located on the base substrate, the pixel defining layer comprising a plurality of openings to define the plurality of light-emitting regions; and a plurality of spacers located at a side of the pixel defining layer away from the base substrate and distributed at an interval between adjacent openings, wherein, a shape of at least one of the plurality of openings is a polygon with at least one vertex angle cut off, and a corner portion of the opening comprises a first corner portion formed by cutting off one vertex angle included between two sides of the polygon from the polygon, at least one of the plurality of spacers is arranged at an interval between the first corner portion and the opening adjacent to the first corner portion, and a connecting line between a geometric center of the opening where the first corner portion is located and a geometric center of the opening adjacent to the first corner portion passes through the first corner portion and the spacer, wherein the plurality of sub-pixels comprise a plurality of first color sub-pixels, a plurality of second color sub-pixels and a plurality of third color sub-pixels, the plurality of first color sub-pixels and the plurality of third color sub-pixels are alternately arranged along both a row direction and a column direction to form a plurality of first pixel rows and a plurality of first pixel columns, the plurality of second color sub-pixels are arranged in an array along both the row direction and the column direction to form a plurality of second pixel rows and a plurality of second pixel columns, the plurality of first pixel rows and the plurality of second pixel rows are alternately arranged along the column direction and staggered from each other in the row direction, and the plurality of first pixel columns and the plurality of second pixel columns are alternately arranged along the row direction and staggered from each other in the column direction, the plurality of openings comprise a plurality of first openings, a plurality of second openings and a plurality of third openings, wherein the plurality of first openings are configured to define the light-emitting regions of the plurality of first color sub-pixels, the plurality of second openings are configured to define the light-emitting regions of the plurality of second color sub-pixels, and the plurality of third openings are configured to define the light-emitting regions of the plurality of third color sub-pixels, at least one of the first opening, the second opening or the third opening comprises the first corner portion, at least part of the plurality of spacers are distributed at the intervals between two adjacent openings arranged along at least one of the column direction or the row direction, wherein the openings that have the first corner portion and are configured to define the light-emitting regions of the sub-pixels of a same color comprise at least two types of openings, in different types of openings, vertices of the first corner portions point to vertices of the corner portions opposite to the first corner portions in different directions, the plurality of spacers comprise a plurality of first spacers and a plurality of second spacers, and the first spacers and the second spacers are distributed at the intervals corresponding to the first corner portions of different types of openings, wherein four second color sub-pixels are arranged between adjacent first spacers along one of the row direction and the column direction, and two first color sub-pixels and two third color sub-pixels are arranged between adjacent first spacers along the other of the row direction and the column direction, four second color sub-pixels are arranged between adjacent second spacers along one of the row direction and the column direction, and two first color sub-pixels and two third color sub-pixels are arranged between adjacent second spacers along the other of the row direction and the column direction.

16. The display substrate according to claim 13, wherein a connecting line between corner portions opposite to each other of two openings located at two sides of the spacer in at least one of the row direction or the column direction and closely adjacent to the spacer is located at a side of a geometric center of the spacer away from the first corner portion.

17. The display substrate according to claim 13, wherein two openings adjacent in at least one of the row direction or the column direction both comprise the first corner portion, and the first corner portions of the two openings are two corner portions closest to each other.

18. The display substrate according to claim 1, wherein a distance between the spacer and the first corner portion located at one side of the spacer is a first distance, and a shortest distance between the spacer and the corner portion of the opening located at the other side of the spacer is a second distance, and the first distance is not less than the second distance.

19. The display substrate according to claim 1, wherein a largest size of at least one spacer in a direction parallel to the connecting line between the geometric center of the opening where the first corner portion is located and the geometric center of the opening adjacent to the first corner portion is a first size, and a largest size of the at least one spacer in a direction perpendicular to the connecting line is a second size, and the first size is smaller than the second size, wherein the display substrate comprises a display area, at least part of the plurality of spacers and the plurality of sub-pixels are located in the display area, and a ratio of a number of the spacers each located at the interval between the first corner portion and the opening adjacent to the first corner portion to a number of the spacers located in the display area is not less than 50%.

20. A display apparatus, comprising the display substrate according to claim 1.

* * * * *